United States Patent [19]

Aramaki

[11] 4,017,846

[45] Apr. 12, 1977

[54] SYNCHRO-TO-DIGITAL CONVERTER

[75] Inventor: Shigeru Aramaki, Tokyo, Japan

[73] Assignee: Tamagawa Seiki Kabushiki Kaisha, Japan

[22] Filed: Apr. 17, 1975

[21] Appl. No.: 568,982

Related U.S. Application Data

[63] Continuation of Ser. No. 347,339, April 2, 1973, abandoned.

[52] U.S. Cl. .......................................... 340/347 SY
[51] Int. Cl.² .......................................... G08C 9/00
[58] Field of Search .............. 340/347 SY, 347 AD; 318/654–661

[56] References Cited

UNITED STATES PATENTS

| | | | |
|---|---|---|---|
| 3,668,693 | 6/1972 | Eaton | 340/347 SY |
| 3,688,303 | 8/1972 | Metz | 340/347 SY |
| 3,713,141 | 1/1973 | Higgins | 340/347 SY |
| 3,827,045 | 7/1974 | Markus | 340/347 SY |

*Primary Examiner*—Charles D. Miller
*Attorney, Agent, or Firm*—McGlew and Tuttle

[57] ABSTRACT

A synchro-to-digital converter converts polyphase a.c. signals, delivered from a synchro, a resolver, or the like (hereinafter called simply a synchro) in correspondence to a rotational angle of the rotor thereof, into digital values. Two phase signals, adjacent to each other in the polyphase synchro signals, are selected in a predetermined mode by the use of higher bit signals obtained from an operational device, and are thereafter introduced into a D-A (digital-analog) converter driven by lower bit signals obtained from the operational device. The output signal from the D-A converter is compared with a reference signal so that the polarity thereof is discriminated. The operational device is continuously driven by the polarity-discriminated until the output signal from the D-A converter becomes zero. Thereby absolute digital values corresponding to the rotational angle of the rotor can be delivered at a high speed.

1 Claim, 27 Drawing Figures

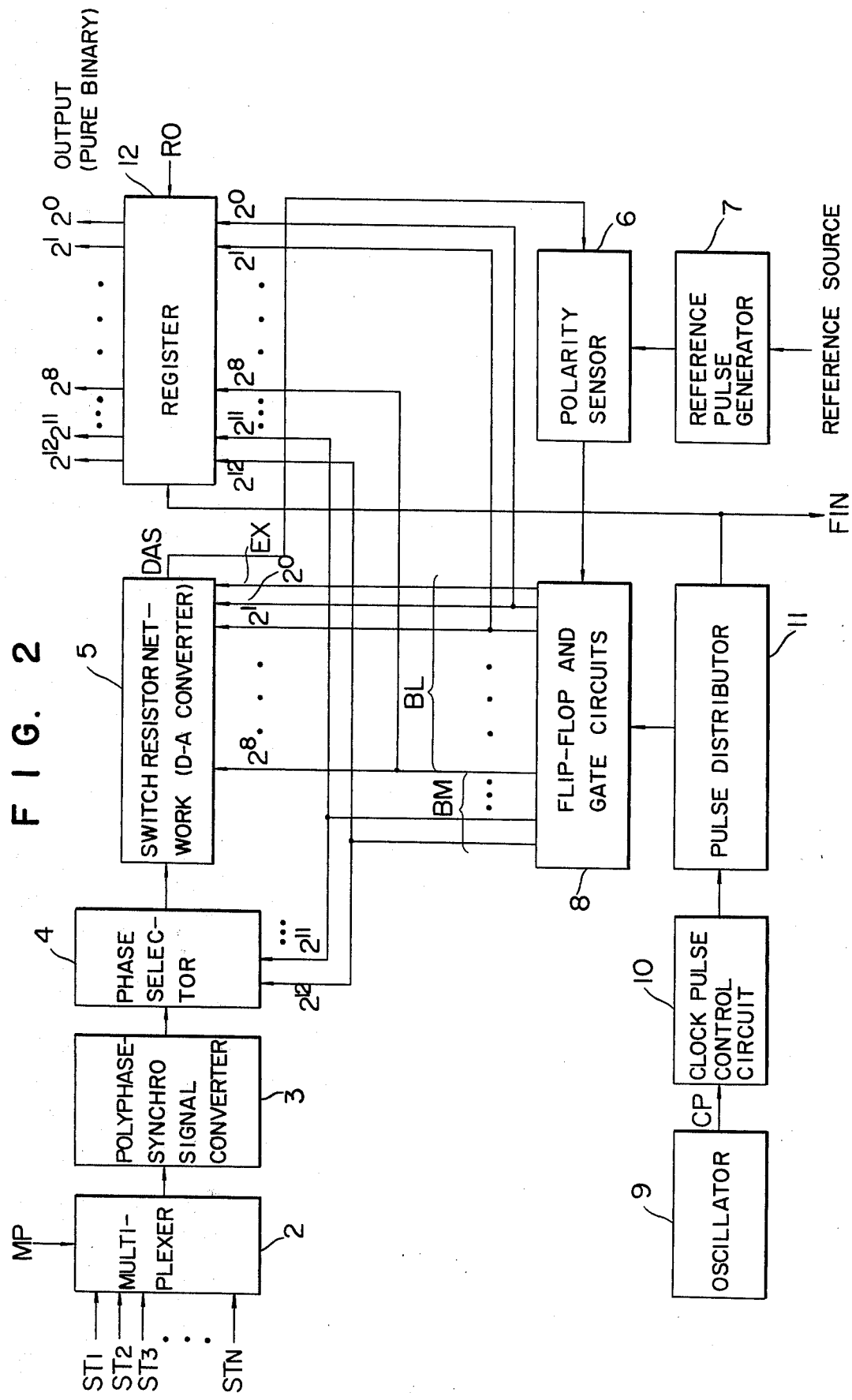

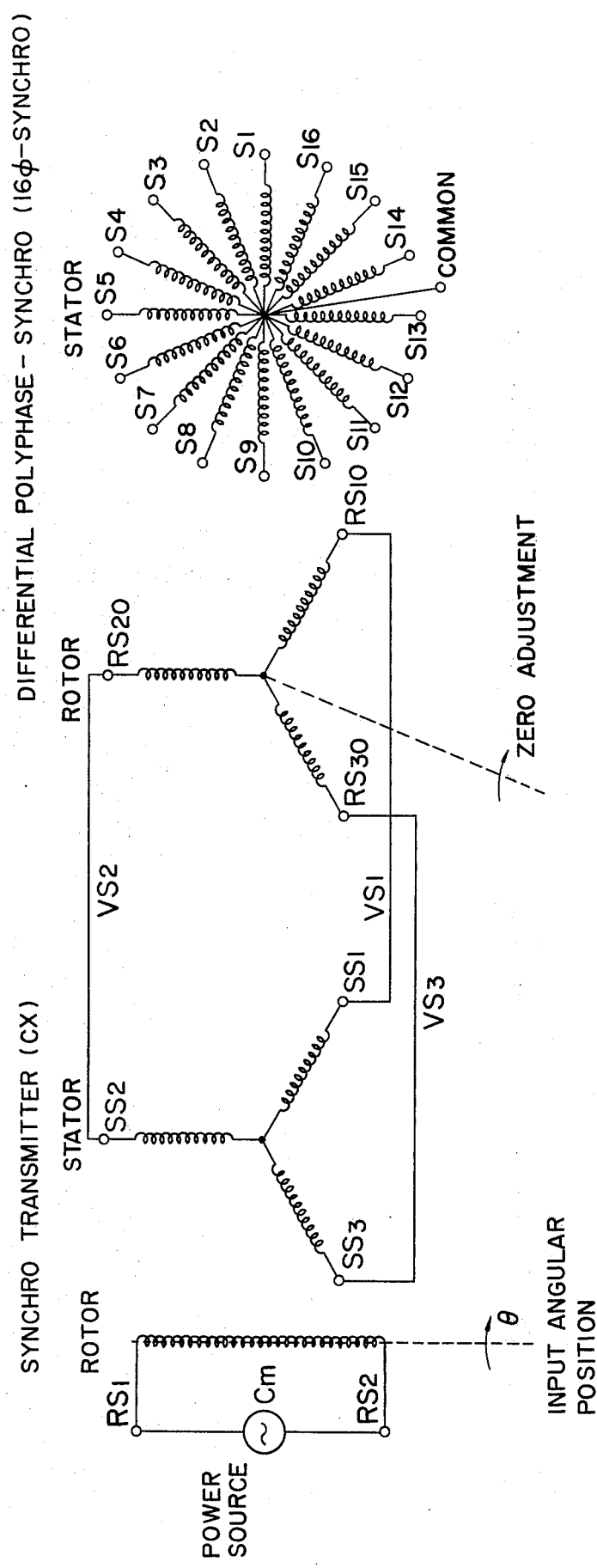

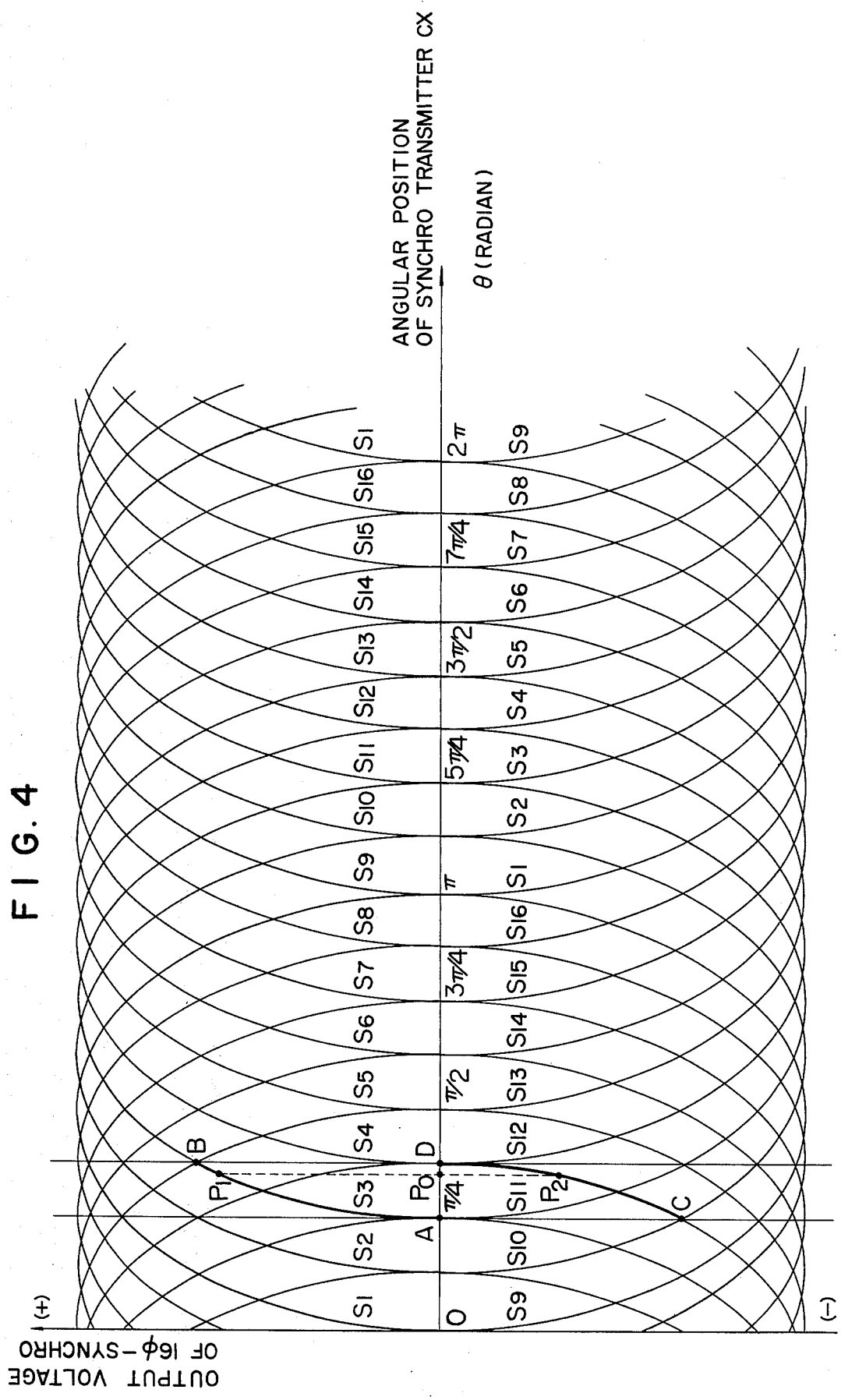

PHASE SHIFTER

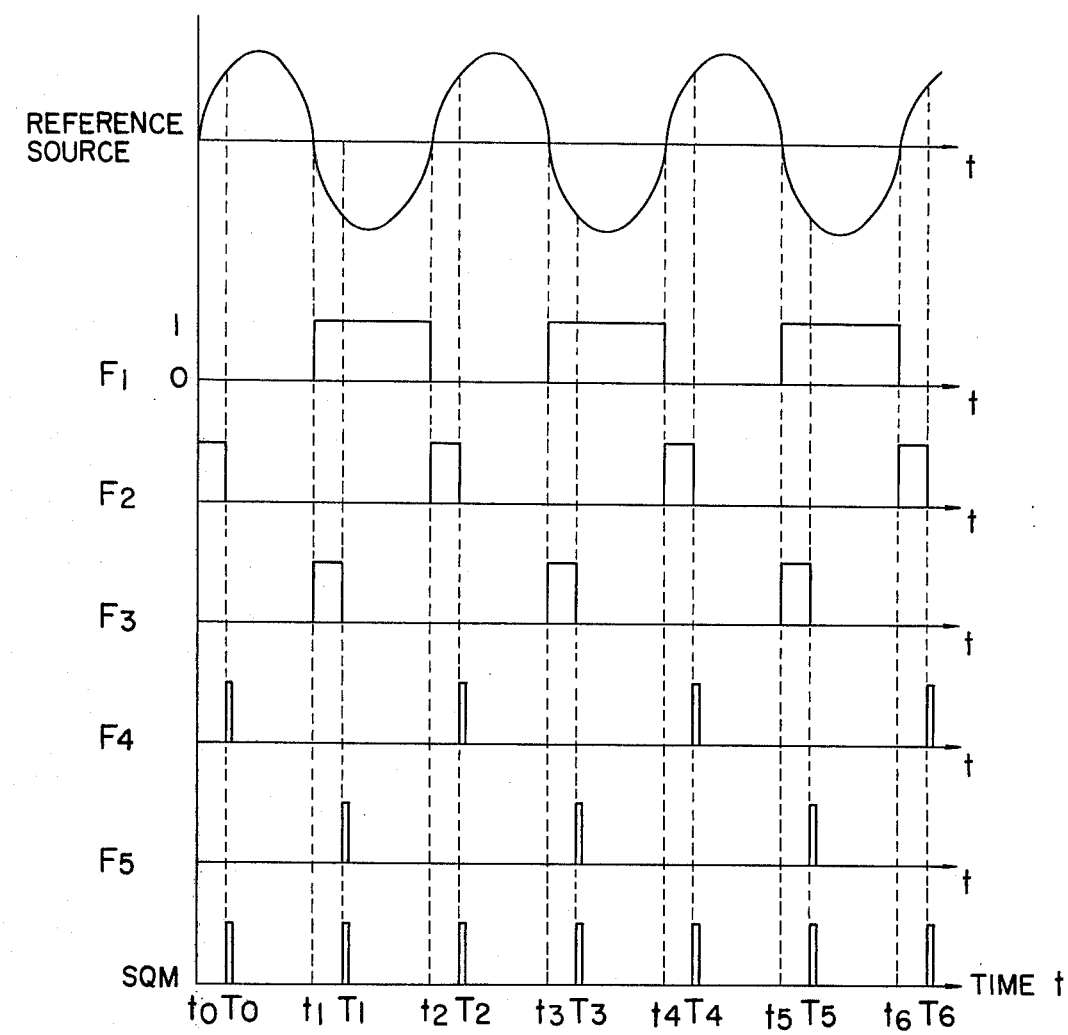

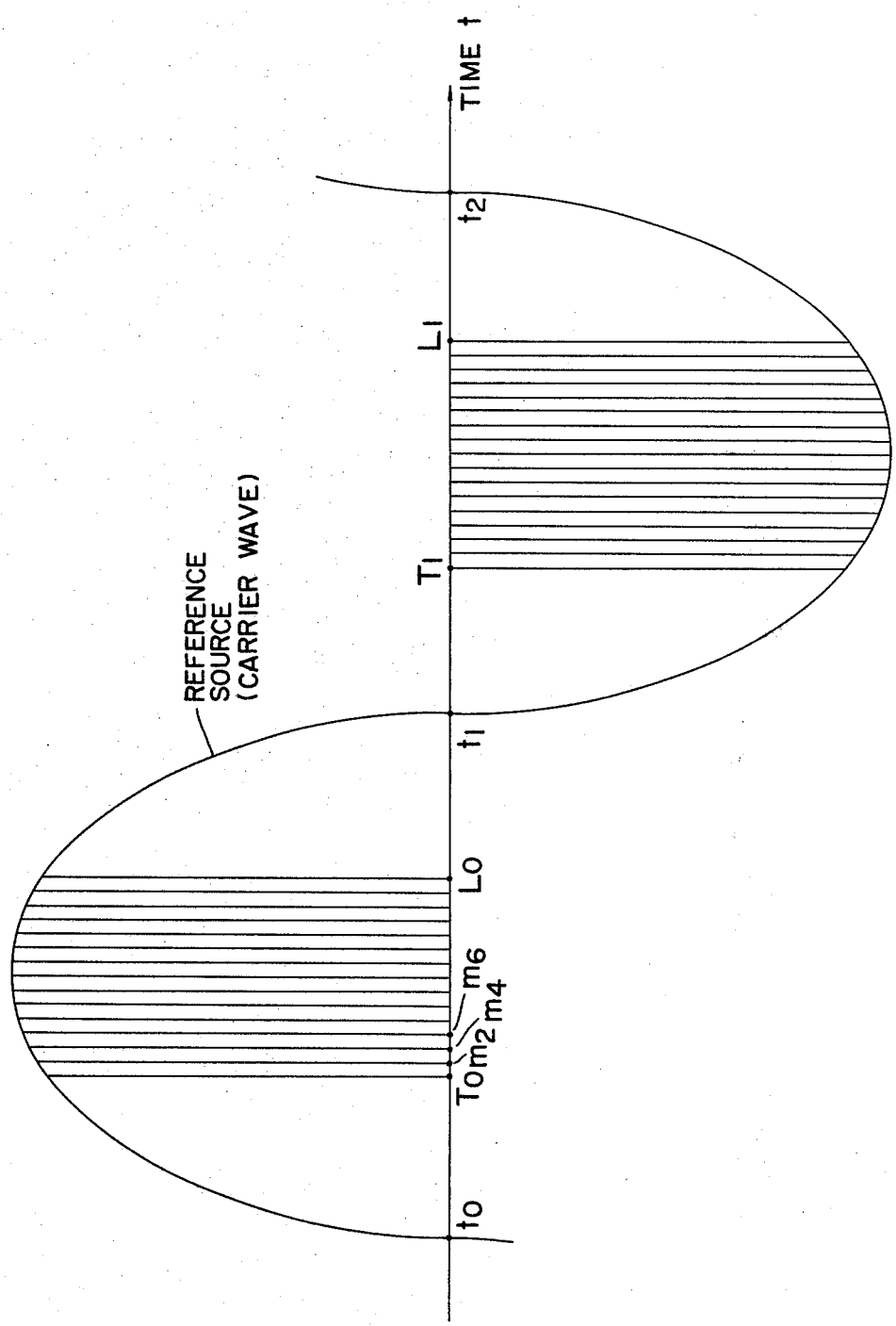

SYNCHRO-TO-DIGITAL CONVERTER

This is a continuation, of application Ser. No. 347,339 filed Apr. 2, 1973 now abandoned.

BACKGROUND OF THE INVENTION

This invention relates to a synchro-to-digital converter for converting a rotational angle of a rotor of a synchro to absolute digital values.

Heretofore, an A-D converter, pulse generator, or the like has been used in a servo-system wherein a rotational angle of a synchro is converted into digital values.

More specifically, the A-D converter is coupled through gear trains and the like to a rotating shaft for obtaining digital values corresponding to the rotational angle of the rotating shaft, and the digital values thus obtained are thereafter transmitted from the detecting position to a control device provided at a remote station. However, such an arrangement has required a number of lead wires extending between the detecting position and the control device in a remote station, and this requirement has constituted a drawback of the conventional device especially when the distance between the detecting position and the control device is considerably long.

Furthermore, the A-D converter employed in the servo-system is inevitably of high precision, and the required ambient conditions therefor are strict. For this reason it is not desirable to use an A-D converter in a detecting position where the ambient conditions are inferior.

On the other hand, a pulse generator generates pulses in accordance with the rotation of the shaft, and these pulses are counted by a counter or the like provided in the control device. Since this method inevitably provides an incremental mode of operation, the detection of an absolute position is not possible in principle, constituting a drawback when a pulse generator is utilized. Furthermore, the detecting element used with a pulse generator as well as with and A-D converter is ordinarily formed by a device having brushes, a photoelectric element of a noncontact type, or a magnetic device, whereby the working conditions thereof are restricted, and the device having brushes is accompanied by the problem of durability.

A synchro-system which is resistant to severe ambient conditions has also been used for detecting the rotational angle of a shaft. When this synchro-system is used for detecting the rotational angle, the required number of transmitting wires can be reduced to three, and an absolute detection of an angle is also possible when a synchro-to-digital converter is provided at the remote station to be operated in conjunction with the synchro-system.

Various types of synchro-to-digital converters have been proposed (for instance, in U.S. Pat. No. 3,071,324). A simple example of a synchro-to-digital converter has included a Scott-T transformer at its input stage, wherein the input rotational angle $\theta$ is converted into signals representing $\sin \theta$ and $\cos \theta$, and the entire 360°-range of the rotational angle $\theta$ is divided into 4 or 8 sectors depending on the signs or magnitudes of these signals, thus obtaining higher output bits representing the rotational angle $\theta$. The sine and cosine signals in each of the sectors are then selected with respect to the modes of the output bits and supplied to a subsequent switch resistor network. According to the polarity of the output of the switch resistor network relative to a reference signal, a series of clock pulses are generated.

The clock pulses are then counted, and the thus counted results are utilized for controlling the switch resistor network which constitutes a D-A converter. That is, an output voltage is obtained from the switch resistor network depending on the counted results (in the form of digital values) obtained from the counter, whereby the rotational angle $\theta$ of the input shaft can be determined by reading out the counted results (in a digital form) at the time the output voltage from the switch resistor network becomes zero.

However, the above described example of the conventional synchro-to-digital converter including a Scott-T transformer has a drawback in that, because the operational range of sine and cosine functions obtained therefrom is divided into sectors such as $4 = 2^2$ or $8 = 2^3$, the digital outputs from the synchro-to-digital converter are limited to the pure binary code, and outputs in the form of binary coded decimal code or ordinary decimal outputs cannot be obtained.

Furthermore, in some specific conditions of the polarity of the sine and cosine functions or the magnitude of the voltage, the operational range of the sine and cosine functions cannot be divided into more than 8 sectors, that is, less than $\pi/4$ sectors, whereby the conversion error becomes too large if linear digital conversions are simply carried out in these sectors. For this reason, a nonlinear digital conversion simulating the sine curve or cosine curve must be effected in these sectors, thus necessitating a D-A converter of an arrangement using a precision resistance network, whereby the production cost is increased.

When it is desired to further divide each sector, a counter is utilized, and the counter is driven from the lower bits. Such an operation requires a considerably long operation period, and the conversion speed of the synchro-to-digital converter is thereby restricted.

In addition, both the positive and negative sides or halves of a reference wave are used for the polarity discrimination, which fact further restricts the controlling speed of the counter.

Although the representation of an absolute value of the rotational angle $\theta$ is possible in the conventional synchro-to-digital converter, the absolute position is determined beforehand by the wiring between the synchro transmitter and the synchro-to-digital converter, thus making it impossible to zero-adjust the thus obtained digital values. For this reason, another differential synchro is inserted between the synchro transmitter and the synchro-to-digital converter for the realization of the zero-adjust, this constituting a further drawback of the conventional synchro-to-digital converter.

SUMMARY OF THE INVENTION

Accordingly, a primary object of the present invention is to provide a synchro-to-digital converter whereby digital values representing an absolute angular position of the rotor of a synchro can be obtained.

Another object of the invention is to provide a synchro-to-digital converter, the construction of which is much simplified by the use of a polyphase-synchro signal converter instead of the conventional Scott-T transformer.

Still another object of the invention is to provide a synchro-to-digital converter which has a simpler construction because of the sine-function signal being digital-converted linearly in a range selected from the outputs of the polyphase-synchro signal converter.

A fourth object of the invention is to provide a synchro-to-digital converter wherein a polyphase-synchro signal converter is employed, so that not only the conventional pure binary code, but also the binary coded decimal code, or the ordinary decimal code can be obtained therefrom.

A fifth object of the invention is to provide a synchro-to-digital converter including a differential polyphase-synchro for reducing the output digits corresponding to any input angle to zero, so that the zero-adjustment of the converter is made possible.

A seventh object of the invention is to provide a synchro-to-digital converter including a timing pulse generating circuit whereby the converter is made insensible to any voltage fluctuation in the power source of the synchro.

An eighth object of the invention is to provide a synchro-to-digital converter wherein polarity discrimination can be carried out with both positive and negative polarities of a reference voltage, yet a high-speed synchro-to-digital conversion can be accomplished.

A ninth object of the invention is to provide a synchro-to-digital converter wherein an angular range for a sine function, selected among the outputs from a polyphase-synchro signal converter, is divided into two parts through a division circuit, whereby the number of output digits is doubled.

A tenth object of the invention is to provide a synchro-to-digital converter wherein three-phase AC signals, constituting the output of a synchro transmitter, are rectified in synchronism with a reference voltage thereby to obtain three-phase DC voltages, the voltages being thereafter introduced into a polyphase-synchro signal converter wherein operations are carried out in a DC system, so that a high-speed conversion of a synchro signal into digital values is made possible.

An eleventh object of the invention is to provide a synchro-to-digital converter wherein a polyphase-synchro signal converter of a solid-state type is employed.

These and other objects of the present invention can be achieved by an improved synchro-to-digital converter comprising a polyphase-synchro signal converter connected to an input synchro transmitter, a D-A converter for receiving two selected phase signals delivered from the polyphase-synchro signal converter, and an operational device controlled by a polarity signal delivered from the D-A converter, whereby the two output signals from the polyphase synchro signal converter are selected by the use of higher bit signals obtained from the operational device, the lower bit signals thereof being used for driving the D-A converter thereby to convert an input rotational angle from the synchro to a digital value.

The nature, principle, and utility of the present invention will be more clearly understood from the following detailed description of the invention when read in conjunction with the accompanying drawings.

BRIEF DESCRIPTION OF THE DRAWINGS

In the drawings:

FIG. 2 is a block diagram showing a synchro-to-digital converter constituting a first embodiment of the present invention;

FIG. 3 is a diagram showing the construction and connection of a synchro transmitter and a differential polyphase-synchro;

FIG. 4 is a diagram showing the relation between output voltages and input rotational angle of a sixteen-phase synchro;

FIG. 10 is a time chart showing waveforms for a description of the operation of the means shown in FIG. 9;

FIG. 11 is a time chart showing operational time instants of a synchro-to-digital converter relative to a reference power source voltage;

DETAILED DESCRIPTION OF THE INVENTION

Figure 1:
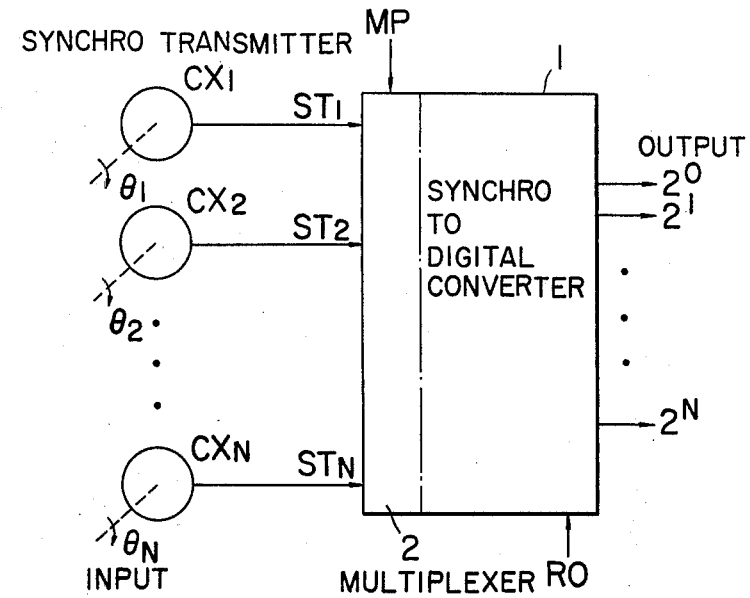
FIG. 1 is a black box of a synchro-to-digital converter to be used with a synchro-system.

First, a case wherein rotational angles $\theta_1, ---, \theta_N$ of a plurality of synchro transmitter $CX_1, ---, CX_N$, as shown in FIG. 1, are converted to digital values by means of a synchro-to-digital converter 1 will be considered. In this case, the selection of synchro transmitters to be digital converted is carried out under the control of a selection signal MP which is an input signal to a multiplexer 2 provided in the synchro-to-digital converter 1, while the output signals thus converted into digital values by the synchro-to-digital converter 1 are detected in synchronism with an input read-out signal RO introduced into the synchro-to-digital converter 1. Of course, the conversion of the outputs can be carried out even if the number of the synchro transmitters is only one, and in this case the multiplexer 2 is not required.

The synchro-to-digital converter system, which has been briefly described hereinbefore, will now be described in more detail with respect to preferred embodiments thereof.

In FIG. 2, there is indicated a synchro-to-digital converter system constituting a first embodiment of the invention. In this embodiment, output signals $ST_1$, $ST_2$, ---, $ST_N$ of synchro transmitters (not shown) are applied to multiplexer 2 wherein one of the output signals is selected responsive to a selection signal MP, to be converted into a digital signal. The output signal thus selected in the multiplexer 2 is supplied to a polyphase-synchro signal converter 3 wherein the output signal is converted into a polyphase-synchro signal. The polyphase-synchro signal is then supplied to a following phase selector 4.

A first example of the polyphase synchro signal converter 3, which is termed a differential polyphase-synchro, is indicated in FIG. 3. The differential polyphase-synchro has a primary winding on the rotor wound in the form of 3-phase windings which are connected to the three-phase output of the synchro transmitter CX. The secondary windings of the differential synchro are wound on the stator thereof in 16-phase windings, $S_1$, $S_2$, ---, $S_{16}$ having a commonly connected neutral point. The number of phases, sixteen in this example, may be changed to any other suitable number depending on the digital bit number in a desired output from the synchro-to-digital converter or the kind of the output digital signal obtained therefrom, that is, whether it is a binary code, BCD code, or the like. However, in the present example, the number of phases is selected, for convenience of the description, at $2^4 = 16$ which is adapted to the pure binary code.

The rotor winding of the synchro transmitter CX is excited from the power source Cm for the synchro-systems, and the output voltages obtainable from the 16 phase windings $S_1$, $S_2$, ---, $S_{16}$ of the stator of the differential polyphase synchro are varied relative to the common terminal voltage, as shown in FIG. 4, when the rotor of the synchro transmitter CX is rotated around its axis. In FIG. 4, the positive polarity for these voltages is selected to coincide with that for the AC reference power source. It will be apparent that the output voltages from the polyphase terminals $S_1$, ---, $S_8$ are of opposite polarities relative to those obtained from other polyphase terminals $S_9$, ---, $S_{16}$. These output voltages, also designated by $S_1$ --- $S_{16}$ can, be expressed as follows when the phase angle of the output voltage $S_1$ is assumed to be zero:

$$S_1 = \sin \theta$$

$$S_2 = \sin\left(\theta + \frac{\pi}{8}\right)$$

$$S_3 = \sin\left(\theta + \frac{\pi}{4}\right)$$

-continued $$S_4 = \sin\left(\theta + \frac{3}{8}\pi\right)$$

$$S_5 = \sin\left(\theta + \frac{\pi}{2}\right)$$

$$S_6 = \sin\left(\theta + \frac{5}{8}\pi\right)$$

$$S_7 = \sin\left(\theta + \frac{3}{4}\pi\right)$$

$$S_8 = \sin\left(\theta + \frac{7}{8}\pi\right)$$

$$S_9 = \sin(\theta + \pi) = \overline{S}_1$$

$$S_{10} = \sin\left(\theta + \frac{9}{8}\pi\right) = \overline{S}_2$$

$$S_{11} = \sin\left(\theta + \frac{5}{4}\pi\right) = \overline{S}_3$$

$$S_{12} = \sin\left(\theta + \frac{11}{8}\pi\right) = \overline{S}_4$$

$$S_{13} = \sin\left(\theta + \frac{4}{3}\pi\right) = \overline{S}_5$$

$$S_{14} = \sin\left(\theta + \frac{13}{8}\pi\right) = \overline{S}_6$$

$$S_{15} = \sin\left(\theta + \frac{7}{4}\pi\right) = \overline{S}_7$$

$$S_{16} = \sin\left(\theta + \frac{15}{8}\pi\right) = \overline{S}_8$$

(1)

Here, if it is desired that the phase angle of any phase winding of the polyphase synchro be reduced to zero, the rotor of the polyphase synchro may be simply rotated relative to the stator. Accordingly, the zero-adjustment of the synchro-to-digital converter of mechanical type, such as this example, can be easily accomplished by simply varying the angular relation between the rotor and the stator thereof.

Zero adjustment is also attained in the case where the three-phase windings on the rotor are changed into two-phase windings which are directly excited from the power source as in the case of the synchro transmitter. For instance windings SS1 and SS3 of the three stator windings of the synchro transmitter CX may be connected together so as to cojointly constitute two phase windings, or a synchro resolver may be used in place of the transmitter.

Alternatively, the polyphase-synchro signal converter 3 may be realized by the use of solid-state elements as described hereinafter.

The three-phase output signals $VS_1$, $VS_2$, and $VS_3$ obtained from the synchro transmitter CX when the rotor thereof is rotated through an angle $\theta$ can be expressed as follows.

$$VS_1 = E_m \sin \theta$$

$$VS_2 = E_m \sin\left(\theta + \frac{2}{3}\pi\right)$$

(2)

-continued $$VS_3 = E_m \sin\left(\theta + \frac{4}{3}\pi\right)$$

wherein $E_m$ is a maximum voltage.

Figure 5:
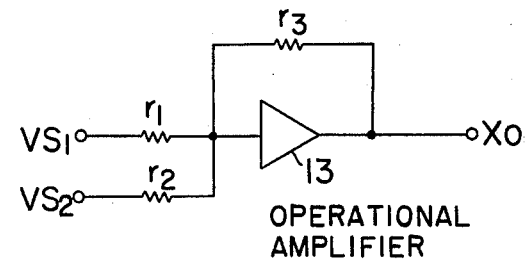
FIG. 5 is a circuit diagram indicating the principle of a solid-state polyphase-synchro.

Now, if the output signals $VS_1$ and $VS_2$ are applied through respective resistors $r_1$ and $r_2$ to an operational amplifier 13 in FIG. 5, the output signal $X_o$ obtainable from the operational amplifier 13 can be expressed as follows:

$$X_o = \frac{r_3}{r_1} VS_1 + \frac{r_3}{r_2} VS_2$$

$$= aE_m \sin\theta + bE_m \sin\left(\theta + \frac{2}{3}\pi\right)$$

$$= E_m\left\{\left(a - \frac{b}{2}\right)\sin\theta + \frac{\sqrt{3}}{2}b\cos\theta\right\}$$

$$= E_m\sqrt{\left(a - \frac{b}{2}\right)^2 + \left(\frac{\sqrt{3}}{2}b\right)^2}\sin(\theta + \alpha)$$

$$= E_m K \sin(\theta\,\alpha) \tag{3}$$

wherein, $$\alpha = \tan^{-1}\frac{\frac{\sqrt{3}}{2}b}{a - \frac{b}{2}}$$

$$K = \sqrt{\left(a - \frac{b}{2}\right)^2 + \left(\frac{\sqrt{3}}{2}b\right)^2}$$

$$a = \frac{r_3}{r_1}, b = \frac{r_3}{r_2}$$

Thus, the predetermined angle $\theta$ of the rotor relative to the stator of the synchro transmitter CX, the phase angle $\alpha$ included in the output signal from the operational amplifier can be varied at will by suitably varying the ratios $r_3/r_1$ and $r_3/r_2$. The same result can be obtained when other pairs of the output signals $VS_2$ and $VS_3$ or $VS_3$ and $VS_1$ from the synchro transmitter CX are applied to the operational amplifier 13. Furthermore, when a number of operational amplifiers associated with resistors, such as $r_1$, $r_2$, and $r_3$, of different values are provided, a corresponding number of output signals, each having a phase angle corresponding to one of the above described polyphase signals (1), can be obtained.

Figure 6:
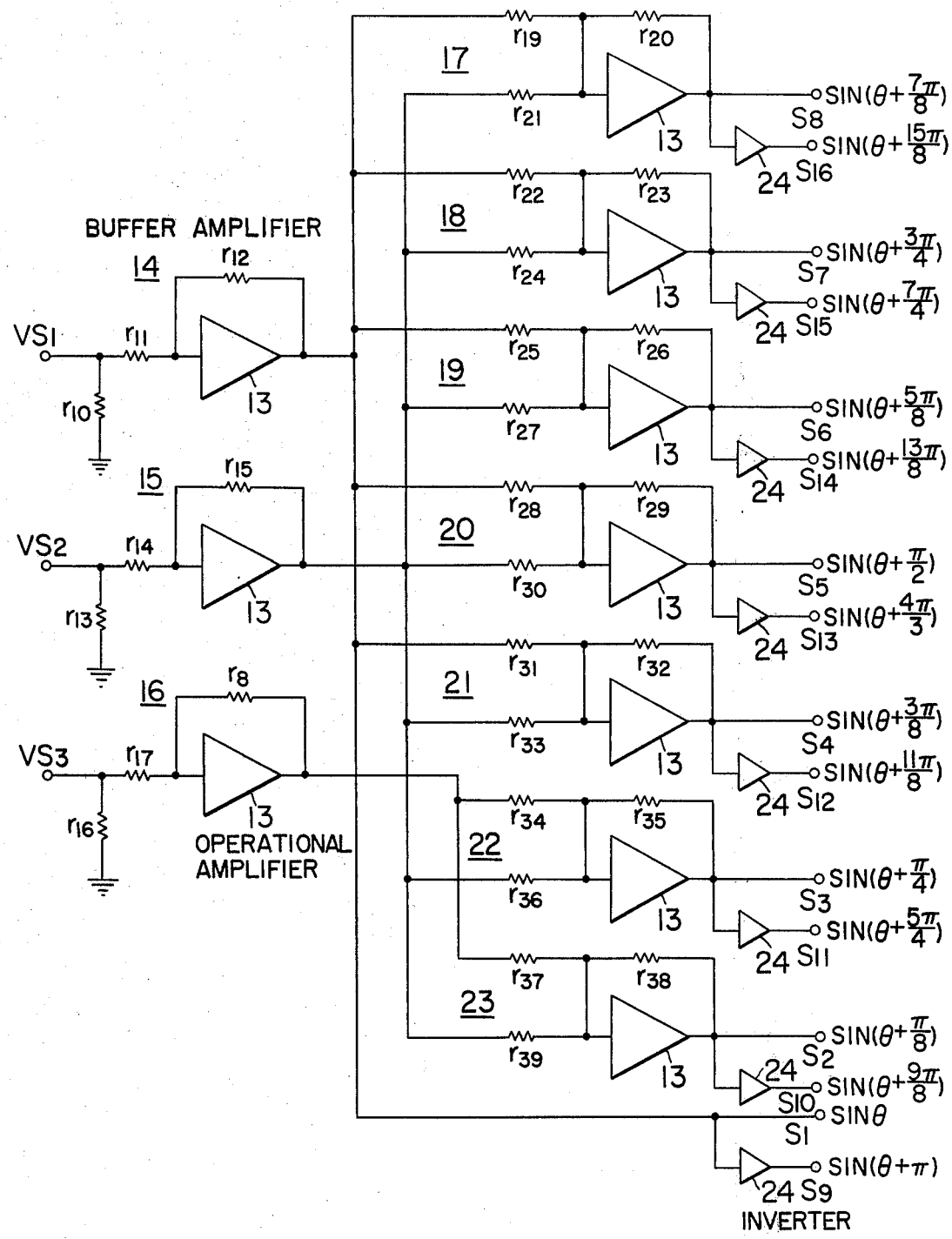
FIG. 6 is a circuit diagram showing an example of a solid-state sixteen-phase synchro.

FIG. 6 illustrates such aa polyphase synchro signal converter having sixteen phases and constituted by solid-state circuit elements. In this example, three buffer amplifiers 14, 15, and 16 are provided for impedance matching between the synchro transmitter CX and the phase shifters 17, 18, - - - 23, and for adjusting voltage gains in the input stage thereof. Three resistors $r_{10}$, $r_{13}$, and $r_{16}$ are connected to ground in advance of the respective $r_{11}$, $r_{14}$, and $r_{17}$ for operatively simulating the common connection of the polyphase windings in the mechanical type 16-phase synchro signal converter shown in FIG. 3.

The output voltages $VS_1$, $VS_2$, and $VS_3$ of the synchro transmitter CX, which are adjusted to a suitable gain by means of the respective buffer amplifiers 14, 15, and 16, are thereafter transferred to subsequently provided phase shifters 17, 18, - - - 23, wherein the output voltages of the synchro transmitter CX are converted into polyphase output signals as described hereinbefore with reference to FIG. 5. As described before, the polyphase voltages $S_9$, $S_{10}$, - - - , $S_{16}$ as shown in (1) can be obtained by reversing the voltages $S_1$, $S_2$, - - - , $S_8$, respectively.

The values of the resistors to be used with the phase shifters 17, 18, - - - , 23 are selected as shown in the following Table 1:

Table 1

| Phase Shifter | Resistance ratio | |
|---|---|---|
| 17 | $\frac{r_{20}}{r_{19}} = 1.00000$ | $\frac{r_{20}}{r_{21}} = 0.38598$ |
| 18 | $\frac{r_{23}}{r_{22}} = 1.00000$ | $\frac{r_{23}}{r_{24}} = 0.73205$ |
| 19 | $\frac{r_{26}}{r_{25}} = 1.00000$ | $\frac{r_{26}}{r_{27}} = 1.16605$ |
| 20 | $\frac{r_{29}}{r_{28}} = 1.00000$ | $\frac{r_{29}}{r_{30}} = 2.00000$ |
| 21 | $\frac{r_{32}}{r_{31}} = 1.00000$ | $\frac{r_{32}}{r_{33}} = 7.00498$ |
| 22 | $\frac{r_{35}}{r_{34}} = 0.26795$ | $\frac{r_{35}}{r_{36}} = 1.00000$ |
| 23 | $\frac{r_{38}}{r_{37}} = 0.61462$ | $\frac{r_{38}}{r_{39}} = 1.00000$ |

As is apparent from the above description, there are two types of polyphase-synchro signal converters 3 which have merits and demerits inherent in their respective constructions. More specifically, the first example, of a mechanical type, has a limitation in the minimizing of its size, and the number of phases cannot be increased excessively because the phases must be actually wound on the stator. However, the rotor thereof can be freely rotated, and the zero-adjustment is thereby made possible, which is an advantageous feature.

On the other hand, the second example, of a solid-state, polyphase-synchro signal converter, has a drawback in that it cannot be zero-adjusted. However, the number of phases thereof can be easily increased to an extent not realizable by the mechanical type, and the size thereof can also be minimized to a greater extent than the latter. Accordingly, the more advantageous of these two types should be selected, depending on the application requirements and the manufacturing economy.

The polyphase-synchro signals obtained from the polyphase-synchro signal converter 3 are thereafter introduced into the phase selector 4 of FIG. 2. In the phase selector 4, two adjacent phases within the polyphase synchro signals are selected under the influence of phase selecting signals BM, which are the higher position bit signals selected from the output signals of "flip-flop and gate circuits" 8. The bit number of the phase selecting signals BM is determined depending on the number of phases in the polyphase-synchro signals. For instance, in the case of eight phase synchro signals, the signals BM of three bits ($8=2^3$) are used, and for the 16-phase synchro signals, four bits ($16=2^4$) BM signals are used.

In this example, four bits of higher positions, $2^9$, $2^{10}$, $2^{11}$, and $2^{12}$ are used as the phase selecting signals BM. Although the relationship between the phase selecting signals BM and the thus selected two adjacent signals in the polyphase synchro signals will be described hereinafter, the two adjacent signals, such as $S_1 - S_2$ or $S_3 - S_4$, thus selected in the phase selecting circuit 4, are delivered into a switch resistor network 5 located in the subsequent stage.

In the switch resistor network 5, the two adjacent signals, such as $S_1 - S_2$ or $S_3 - S_4$, are D-A converted in a linear manner under the influence of lower position bit signals BL, such as $2^8, 2^7, ---$, which are the remaining signals after the high position bit signals BM are selected out of the output signals from the "flip-flop and gate circuit" 8.

The switch resistor network 5 may be any suitable AC D-A converter available on the market. However, the network 5 will be described hereinbelow with respect to an example thereof shown in FIG. 7.

Figure 7:
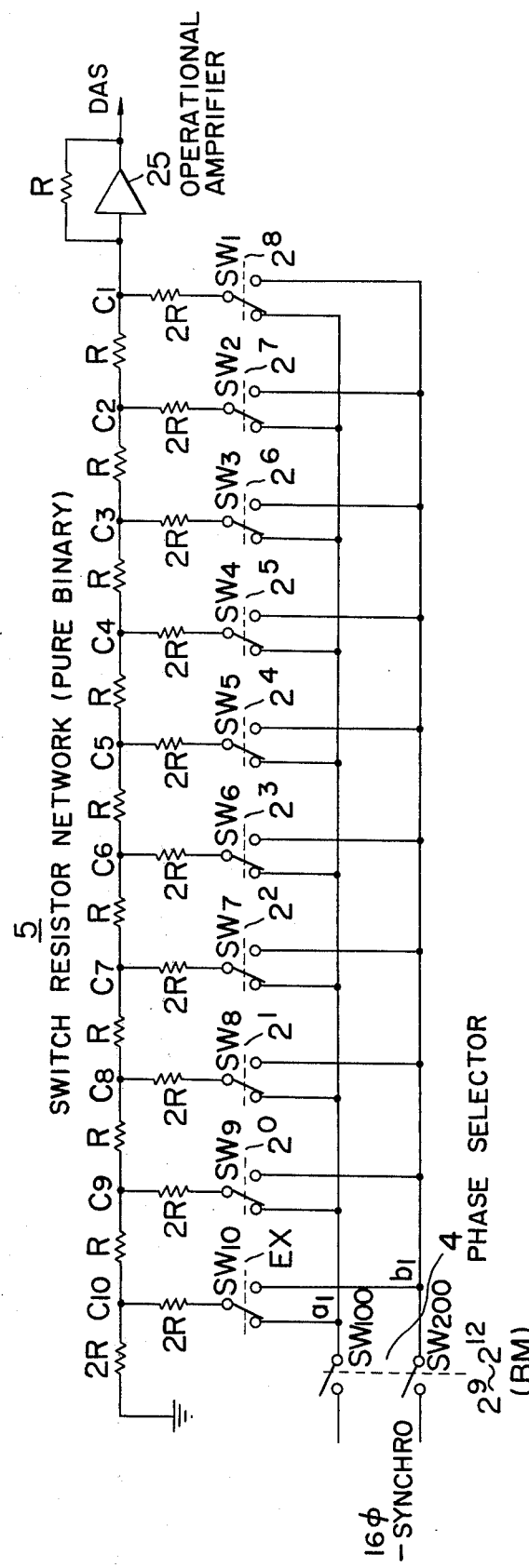
FIG. 7 is a circuit diagram showing an example of a switch resistor network used in the example shown in FIG. 2.

In FIG. 7, switches $SW_{100}$ and $SW_{200}$ represent the part of the phase selector 4 which selects two adjacent phase signals by the aid of the phase selecting signals BM. Switches $SW_1$ through $SW_{10}$ in the subsequent stage are operated by the lower position bit signals BL such as $2^8$, $2^7$, $---$, from one switch position to the other, whereby the two adjacent phase signals are added together under a weight of (½). More specifically, it is assumed that the two adjacent phase signals selected in the phase selector 4 are 128V at the position $a_1$ and OV at the position $b_1$. If the switches $SW_1$ through $SW_{10}$ are placed in the positions shown in FIG. 7 under the actions of the signals BL, such as $2^8, 2^7, ---$, the voltage at the point $C_1$ will become 128V × ½, the voltage at the point $C_2$ will become 128V × $1/2^2$, and so forth, and all of the voltages at the points $C_1$, $C_2$, $C_3$, $---$ being added together, the output voltage DAS from the operational amplifier is utlimately equalized with the voltage at the point $a_1$, which is equal to 128V.

Likewise, when the positions of the switches $SW_1$ through $SW_{10}$ are brought into the switch positions opposite to those indicated in FIG. 7, the output voltage DAS from the operational amplifier is equalized with the voltage at the point $b_1$, which is equal to 0 V.

Although, in the above description, the adding operation of the switch resistor network 5 has been described under the assumption that the voltage at the point $a_1$ is 128V, and the voltage at the point $b_1$ is 0 V, the voltage at the point $a_1$ may be a positive potential and the voltage at the point $b_1$ may be a negative potential. In this case, the positions of the switches $SW_1$ through $SW_{10}$, whereby the output voltage DAS of the network 5 is caused to be zero, can be determined. Thus, when the positions of the switches $SW_1$ through $SW_{10}$ determined by "0" or "1" of the input BL signals $2^8$, $2^7$, $---$ for causing the output voltage DAS to be zero, are read out, the zero output positions of the switches $SW_1$ through $SW_{10}$ corresponding to an input phase voltage can be detected.

In the above description, although the two input voltages have been described as two DC voltages, the same result may also be obtained in the cases where the two input voltages are AC voltages. For instance, when an input signal of a positive phase relative to a reference voltage is applied to the point $a_1$, and another input signal of a negative phase relative to the reference voltage is applied to the point $b_1$, the zero-voltage position between the two phase voltages can be determined.

Accordingly, when the switches $SW_{100}$ and $SW_{200}$ are selected so that certain voltages of positive and negative polarities are obtained therefrom, the positions of the switches $SW_1$ through $SW_{10}$, for zero output from the operational amplifier 25, are determined, and, when the two voltages selected by the switches $SW_{100}$ and $SW_{200}$ are varied, the positions of the switches $SW_1$ through $SW_{10}$ for zero output from the operational amplifier 25 are also varied.

Accordingly, when a phase selecting range for a polyphase synchro signal, which is defined by two phase voltages selected by, or instance, switches $SW_{100}$ and $SW_{200}$, is selected between the output signals $S_3$ and $S_4$ shown in FIG. 4, that is in a range of $\pi/4 \leq \theta \leq 3\pi/8$, then a phase position P$o$ defined by the positions of switches $SW_1$ through $SW_{10}$, for zero output from the operational amplifier, is moved in the phase selecting range from a point A on the curve $S_3$ to the point D for on the curve $S_4$ depending on the rotational angle $\theta$ of the synchro. Thus, by detecting this phase position (hereinafter called zero position) P$o$ by the use of the above described D-A converter, the rotational angle $\theta$ of the synchro in a range of $\pi/4 \leq \theta \leq 3\pi/8$ can be converted into a digital value. Likewise, a rotational angle $\theta$ of the synchro in a range of $3\pi/8 \leq \theta \leq \pi/2$ can be converted into a digital value by changing over the phase selecting range in the phase selector to $S_4 - S_5$.

Thus, if the phase selecting range for the switch resistor network is changed from one to the other at each position where the polarities of the two input signals become opposite to each other, the rotational angle $\theta$ of the synchro transmitter can be converted into an absolute digital value corresponding thereto within one entire revolution range of $\pi \leq \theta \leq 2\pi$.

In order to describe the detection of the zero position P$o$ in more detail, the constructions and operations of a polarity sensor 6, a reference pulse generator 7, a "flip-flop and gate circuit" 8, and other components indicated in FIG. 2 will be described with reference to FIGs. 8 through 13.

The AC output signals DAS from the switch resistor network 5 is introduced to the polarity sensor 6 of FIG. 2, wherein the output signal is compared with a reference pulse signal generated from the reference pulse generator 7, and the polarity of the output signal relative to a reference voltage is thereby descriminated. The output signal from the polarity sensor 6 is then applied to one input terminal of the "flip-flop and gate circuits" 8. Another input terminal of the "flip-flop and gate circuits" 8 is connected to the output of series connected circuits comprising an oscillator 9, a clock pulse control circuit 10, and a pulse distributor 11. The output signals from the "flip-flop and gate circuits" 8 are divided into the phase selecting signals BM and the D-A conversion signals BL as described before, and supplied to the phase selector 4 and the switch resistor network 5, respectively.

Figure 8:
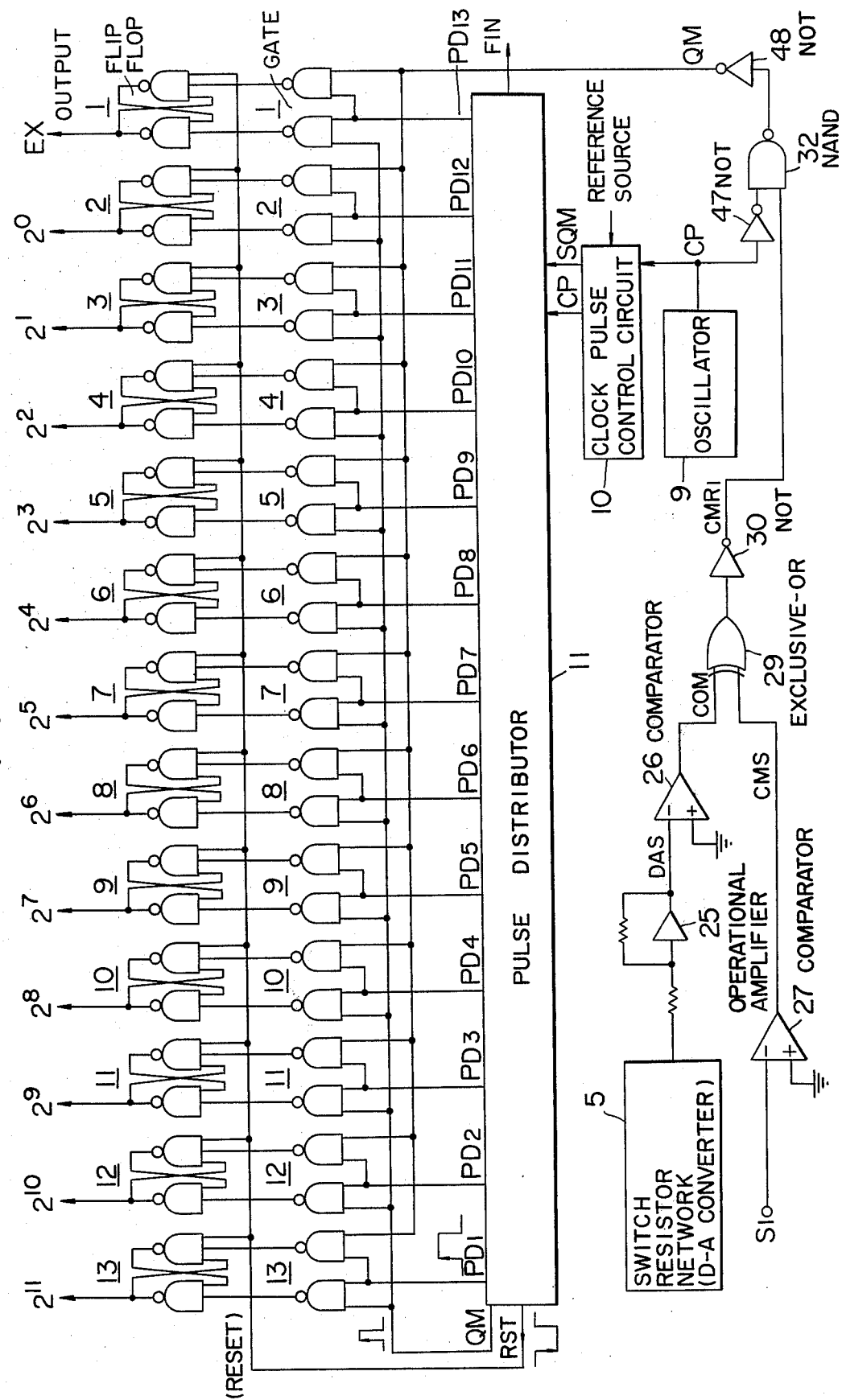
FIG. 8 is a circuit diagram showing an example of an operational device used in a synchro-to-digital converter according to this invention.

As more clearly indicated in FIG. 8, the output AC signal DAS from the switch resistor network 5 is supplied to amplifier 25 to a comparator 26, wherein the signal DAS is converted, by the effect of a pulse $F_1$ of the reference signal (see FIG. 10) into a pulse series COM. Since the output DAS signal is ultimately used for detecting the zero position Po, a detection in a low signal range becomes a problem. Accordingly, it is desirable that the gain of the operational amplifier 25 be adjusted to a suitable value, and the output pulse train COM obtained from the comparator 26 be thereby adjusted accurately to a desired signal level.

On the other hand, one phase voltage $S_1$ from the polyphase synchro is also converted into a pulse train CMS in a compartor 27 and introduced, together with the pulse train COM, into an exclusive-OR gate 29. The output of the exclusive-OR gate 29 is passed through a NOT gate 30 and converted into a pulse train $CMR_1$. The results of the above described logical operations are summarized in Table 2.

Table 2

| COM | CMS | $CMR_1$ |
|---|---|---|
| 0 | 0 | 1 |
| 1 | 0 | 0 |
| 0 | 1 | 0 |
| 1 | 1 | 1 |

Through the above described procedure, the output signal DAS of the switch resistor network 5 is compared with phase voltage $S_1$ voltage of the polyphase synchro, and the polarity of the output DAS relative to the phase voltage $S_1$ is discriminated. In other words, whether the rotational angle $\theta$ is on one side or the other of the voltage $S_1$, with respect to the origin, is discriminated.

When the rotational angle $\theta$ and the phase voltage $S_1$ are discriminated to be in the same phase, that is, when the pulse train COM and the pulse train CMS are in a logical relation such as [00] or [11], the rotational angle $\theta$ is in the same semicircle wherein the phase voltage $S_1$ is disposed, and when the rotational angle $\theta$ and the phase voltage $S_1$ are discriminated to be in opposite phases, that is, when the pulse train COM and pulse train CMS are in a logical relation such as [10] or [01], the rotational angle $\theta$ is judged to be in the opposite semicircle wherein the phase voltage $S_9$ is disposed. In the latter case, the inverted phase voltages $S_1$ through $S_8$ are used for obtaining the digital value of the rotational angle $\theta$.

As will be apparent from FIG. 8, clock pulse CP applied to an input terminal of NAND gate 32 passes through the NAND gate 32 only when the above-mentioned polarity discriminating signal $CMR_1$, applied to gate 32, is "1" and does not pass through the NAND gate 32 when the signal $CMR_1$ is "0", whereby the output $Qm$ obtained from a NOT gate 48 becomes "1".

On the other hand, the pulse distributor 11 is operated from the oscillator 9 through the clock pulse control circuit 10 as described before. Prior to the operation of the pulse distributor 11 being described, the way a timing pulse SQM is used in the clock pulse control circuit 10 will be described with reference to FIGS. 9 and 10. Here, the timing pulse SQM is of a kind adapted to be used for initiating effectively the operation of the synchro-to-digital conversion in accordance with the frequency of the power source for the synchro-system.

Figure 9:
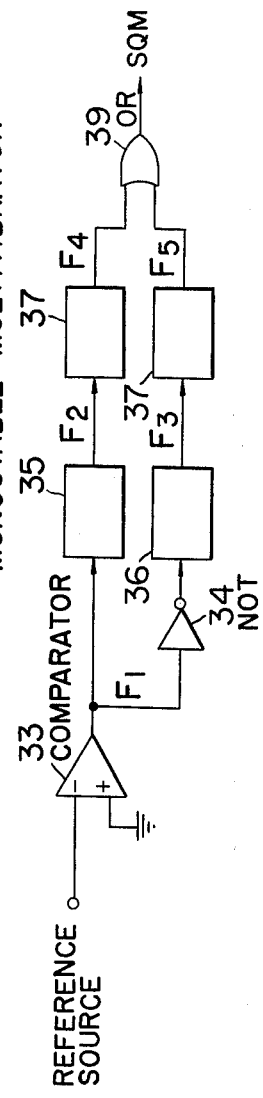
FIG. 9 is a block diagram indicating an example of means for obtaining timing pulses.

Referring to FIG. 9, a reference source signal is introduced into a comparator 33, and a pulse train $F_1$, synchronized with the carrier frequency as shown in FIG. 10, can be obtained from the comparator 33. The pulse train $F_1$ is then applied simultaneously to a monostable multivibrator 35 and to a combination of a NOT gate 34 and another monostable multivibrator 36, whereby rectangular pulse trains $F_2$ and $F_3$ (refer to FIG. 10), both rising at zero-cross positions of the carrier and falling prior to the positive or negative peak points of the carrier, can be obtained. These trains $F_2$ and $F_3$ are respectively applied to subsequent monostable-vibrators 37 and 38, thereby to be placed in narrower pulse trains $F_4$ and $F_5$. These pulse trains $F_4$ and $F_5$ are then applied to an OR gate 39, thereby to obtain the timing pulses SQM.

As shown in FIG. 10, the time instants $T_o$, $T_1$, - - - of the timing pulses SQM synchronized with the reference source signal can be varied by varying settings of the pulse width of the monostable multivibrators 35 and 36, so that the time instants can be adjusted in accordance with the carrier frequency of the synchro system and with the output bit number whe used in the synchro-to-digital converter. Although the adjusted positions thereof are described hereinafter, they are adjusted in such a manner that each peak position of the carrier coincides with the intermediate position of a respective logical operation period of, for instance $t_o - t_1$.

Since the accuracy of the comparator 33 is very high, the waveform of the output rectangular pulses is not varied even if the carrier frequency deviates, and the pulse widths of the monostable multivibrators 35 through 38 are also not varied when these are once set. Accordingly, a stable operation of the synchro-to-digital converter can be obtained even if the voltage or frequency of the carrier deviates, because the synchronizing positions of the timing pulse train SQM to the carrier are not varied.

The example of the synchro-to-digital converter shown in FIG. 8 operates as follows.

When the timing pulse train SQM enters the pulse distributor 11, an output signal RST is delivered from the pulse distributor 11, and flip-flops 1 through 13 provided in the "flip-flop and gate circuits" 8 are thereby reset. All of the outputs from the flip-flops 1 through 13, that is, EX, $2^0$, $2^1$, - - -, $2^{11}$ become "0." In this example, no flip-flop is provided for delivering an MSB (most significant bit) that is, the output $2^{12}$. The reason for this is as follows. The synchro-to-digital converter of this example is operated with the phase voltage $S_1$ used as a reference, and the polarities of the phase voltages $S_9$ through $S_{16}$ are reversed relative to the phase voltages 1 through 8. Thus, the reversing signal can be used as the MSB $s^{12}$ signal.

In FIG. 8, although each of the flip-flops 1 through 13 is made up of 2 NAND gate circuits, it will be apparent that the reset-set type flip-flops may also be composed of any other circuit elements of suitable type. When the flip-flops comprise NAND gate circuits, both the reset and set operations thereof are effectuated by a "0" signal.

After the reset signal RST is delivered from the pulse distributor 11 for obtaining "0" outputs from all of the flip-flops 1 through 13, an allocation pulse $PD_1$ is applied to the gate 13 for the highest bit thereby to phase the gate 13 in the ON state. Here the ON state of a gate is a state in which a flip-flop following the gate is readily reversed when a signal "1" is applied to the other input terminal of the gate. Likewise, the herein defined OFF state of the gate is a state in which a flip-flop following the gate is not reversed even if a signal "1" is applied to the other input terminal of the gate.

Accordingly, in a condition where an allocating pulse $PD_1$ is placing the gate 13 into the ON state, if a reversing pulse QM arrives at the other input terminal of the gate 13, the output "0" of the gate 13 will be introduced into the set terminal of the subsequent flip-flop 13, and the output thereof will thereby be reversed from "0". After the output of the flip-flop 13 has been thus reversed to "1", if the signal $Qn$ becomes "1", the output of the flip-flop will be brought back to "0". However, if the signal $Qn$ remains in the state "0"; the output of the flip-flop will be maintained at "1".

After the output of the flip-flop 13 has been maintained at "1" or "0" as described above, an allocating pulse $PD_2$ is now introduced into the gate 12, and the gate 13 is placed in the "OFF" state. In this condition, the output $2^{11}$ of the flip-flop 13 following gate 13 is not reversed even if a "1" signal of the reversing pulse QM or of the signal $Qn$ is applied to the gate 13, and the output $2^{11}$ of flip-flop 13 is maintained at the previous state.

On the other hand, the gate 12 now brought into the ON state, acts as described above with respect to the gate 13, and maintains the output $2^{10}$ of the following flip-flop 12 in "1" or "0".

The above described operation is repeated for the subsequent flip-flops, and when the operation of the flip-flop 1 is completed, a termination signal FIN is delivered from the pulse distributor 11. It should be noted that the above described signal $Qn$ is controlled by the polarity discriminating signal CMR1, and only when the polarity discriminating signal CMR1 becomes "1", a signal CP, which is an inverted signal of the clock pulse CP is delivered.

The operation of the example shown in FIG. 8 will be described in more detail with reference to FIGS. 11 through 14.

In FIG. 11, there is indicated a relation between the above described operation periods and the carrier. In this graphical representation, the time instants when the timing pulses SQM are generated are indicated by $T_o, T_1, ---$. From these generated instants of the timing pulses, the operation of the synchro-to-digital converter is started and is completed at the time instants $L_o, L_1, ---$, whereupon the termination signal FIN is issued. As is apparent in the diagram, the timing pulses SQM are generated in either of the positive and negative half-cycles of the carrier wave, and each cycle of the operation is started at these time instants. This means that two cycles of the operations are carried out in one cycle of the carrier wave, and a high-speed synchro-to-digital conversion is thereby made possible.

Figure 12:
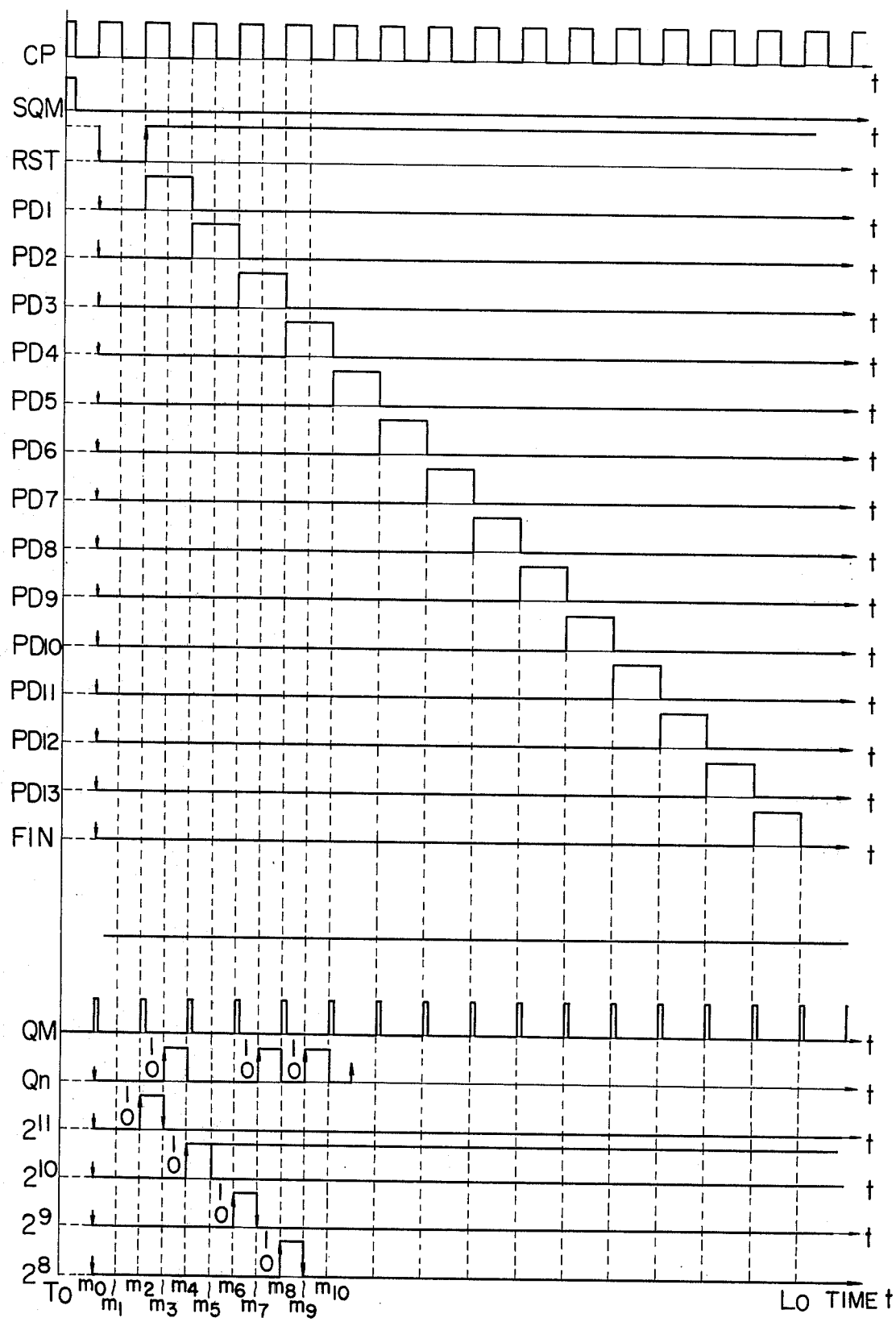
FIG. 12 is a time chart for a description of the operation of a synchro-to-digital converter according to the invention.

Individual operational periods are shown in FIG. 11 by the discrete lengths of $T_oL_o, T_1L_1, ---$, and in FIG. 12, conditions of various parts in the synchro-to-digital converter are indicated relative to each of these operational periods.

As will be apparent in the time chart shown in FIG. 12, after the generation of a timing pulse SQM at the instant $T_o$, when the first clock pulse CP rises at a time instant $m_o$, the first allocation pulse, that is a reset signal RST, is issued. At this time instant $m_o$, outputs of all of the allocation pulses $PD_1$ through $PD_{13}$ and the termination signal FIN are brought into "0", whereby the above described gates 1 through 13 are all placed in the "OFF" state. In addition, all of the allocation pulses $RST_1$, $PD_1$ through $PD_{13}$, and the termination signal FIN, are issued in synchronism with the clock pulses CP, and a timing pulse SQM, a reset signal RST, allocating pulses $PD_1$ through $PD_{13}$, and a termination signal FIN are issued in this order as one cycle of the repeated operations.

For this reason, a ring counter, a shift register, or a binary counter having an output of more than 15 bits should be used as the pulse distributor 11. In other words, upon the reception of the timing pulse SQM, the above described one cycle of operation is started in the pulse distributor 11, issuing allocation pulses sequentially in synchronism with the clock pulses CP, and when the termination signal FIN constituting the last bit is issued, one cycle of operation terminates. In the meantime, when the next timimg pulse SQM is received, the same operation is repeated as the next cycle of the operation.

The operational principle of the allocation pulses $PD_1$ through $PD_{13}$ will now be described with reference to FIGS. 13 and 14.

Figures 13, 14:
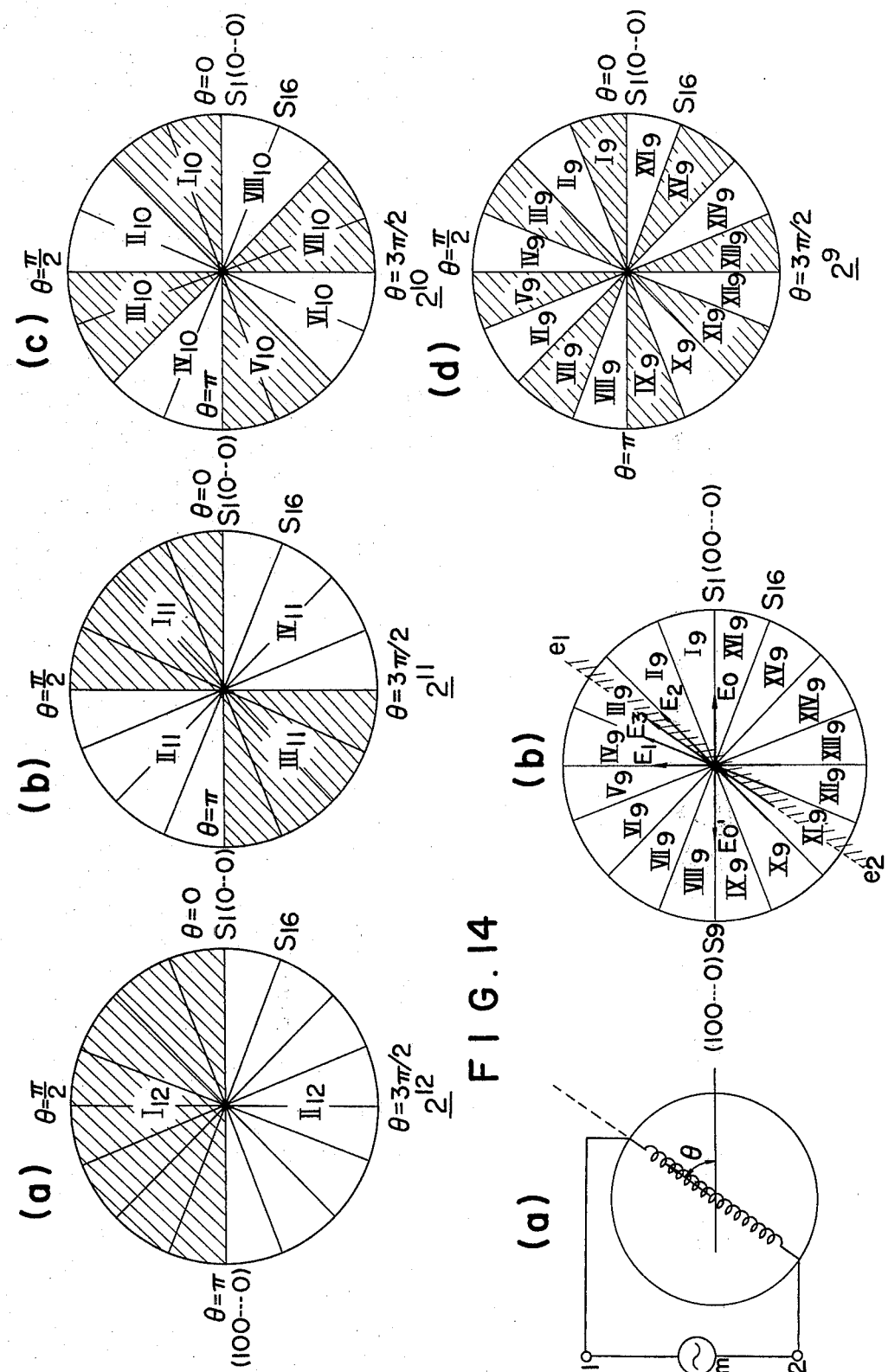
FIGS. 13(a) through 13(d) are diagrams for a description of a phase selecting function of a polyphase-synchro signal converter.
FIGS. 14(a) and 14(b) are diagrams for a description of the operational principle of the synchro-to-digital converter, wherein an input rotational angle of the input shaft is indicated by vectors corresponding to the phase voltages of the polyphase-synchro converter.

FIGS. 13 $(a)$, $(b)$, $(c)$, and $(d)$ indicate the distribution of "1" and "0" conditions of the output bits $2^{12}$, $2^{11}$, $2^{10}$, and $2^9$, respectively, with respect to the $2\pi$ range of the synchro transmitter rotating angle $\theta$ and also to the output phase positions of the polyphasesynchro signal converter 3. In FIGS. 13 $(a)$ through $(d)$, the cross-hatched portions are in "0" condition, and portions without cross-hatching are in "1" condition. In a similar manner, the "0" and "1" condition ranges can be indicated for other output bits $2^8, 2^7, ---$. However, these representations are omitted for the purpose of simplicity.

Since it is considered that the $S_1$ phase is in the absolute zero position 000 - - - 0, the output bit $2^1$ is "0" in a range $I_{12}$ corresponding to $0 \leq \theta < \pi$ range of the rotating angle $\theta$, and is "1" in a range $II_{12}$ corresponding to $\pi \leq \theta < 2\pi$. Likewise, the output bit 2." is "0" in the ranges $I_{11}$ and $III_{11}$ corresponding respectively to $0 \leq \theta < \pi/2$ and $\pi \leq \theta < 3/2\pi$, and is "1" in the ranges $II_{11}$ and $IV_{11}$ corresponding to $\pi/2 \leq \theta < \pi$ and $(3\pi/2) \leq \theta < 2\pi$, respectively. The distributions of "0" and "1" conditions are also determined for other output bits $2^{10}, 2^9, ---$ in a similar manner, and these are summarized in the following Table 3:

Table 3

| $2^{12}$ | $2^{11}$ | $2^{10}$ | $2^9$ | $\theta$ | Selected position P |
|---|---|---|---|---|---|
| 0 | 0 | 0 | 0 | $0 \leq \theta < \frac{\pi}{8}$ | $S_1 - S_2$ |
| 0 | 0 | 0 | 1 | $\frac{\pi}{8} \leq \theta < \frac{\pi}{4}$ | $S_2 - S_3$ |
| 0 | 0 | 1 | 0 | $\frac{\pi}{4} \leq \theta < \frac{3\pi}{8}$ | $S_3 - S_4$ |
| 0 | 0 | 1 | 1 | $\frac{3\pi}{8} \leq \theta < \frac{\pi}{2}$ | $S_4 - S_5$ |
| 0 | 1 | 0 | 0 | $\frac{\pi}{2} \leq \theta < \frac{5\pi}{8}$ | $S_5 - S_6$ |
| 0 | 1 | 0 | 1 | $\frac{5\pi}{8} \leq \theta < \frac{3\pi}{4}$ | $S_6 - S_7$ |
| 0 | 1 | 1 | 0 | $\frac{3\pi}{4} \leq \theta < \frac{7\pi}{8}$ | $S_7 - S_8$ |
| 0 | 1 | 1 | 1 | $\frac{7\pi}{8} \leq \theta < \pi$ | $S_8 - \overline{S}_1$ |
| 1 | 0 | 0 | 0 | $\pi \leq \theta < \frac{9\pi}{8}$ | $\overline{S}_1 - \overline{S}_2$ |
| 1 | 0 | 0 | 1 | $\frac{9\pi}{8} \leq \theta < \frac{5\pi}{4}$ | $\overline{S}_2 - \overline{S}_3$ |

Table 3-continued

| $2^{12}$ | $2^{11}$ | $2^{10}$ | $2^9$ | $\theta$ | Selected position P |
|---|---|---|---|---|---|
| 1 | 0 | 1 | 0 | $\frac{5\pi}{8} \leqq \theta < \frac{11\pi}{8}$ | $\overline{S_3} - \overline{S_4}$ |
| 1 | 0 | 1 | 1 | $\frac{11\pi}{8} \leqq \theta < \frac{4\pi}{3}$ | $\overline{S_4} - \overline{S_5}$ |
| 1 | 1 | 0 | 0 | $\frac{4\pi}{3} \leqq \theta < \frac{13\pi}{8}$ | $\overline{S_5} - \overline{S_6}$ |
| 1 | 1 | 0 | 1 | $\frac{13\pi}{8} \leqq \theta < \frac{7\pi}{4}$ | $\overline{S_6} - \overline{S_7}$ |
| 1 | 1 | 1 | 0 | $\frac{7\pi}{4} \leqq \theta < \frac{15\pi}{8}$ | $\overline{S_7} - \overline{S_8}$ |
| 1 | 1 | 1 | 1 | $\frac{15\pi}{8} \leqq \theta < 2\pi$ | $\overline{S_8} - \overline{S_1}$ |

As is apparent from Table 3, combinations of four output bits of higher positions, $2^{12}$ through $2^9$, correspond to divided phase positions in 16 modes of the rotating angle $\theta$ of the input shaft, the phase positions thus divided in 16 modes being indicated in the column under the selected position P in Table 3.

Thus the phase selector 4 in FIG. 2 may comprise a number of switches, operated by the four output bits of higher positions thereby to deliver the 16 mode signals, and a logic circuit associated with these switches.

In FIG. 14(b), the line $e_2 - e_1$ is a polar voltage vector having a phase angle equal to the rotational angle $\theta$ of the input shaft. When the output of the synchro-to-digital converter coincides with the polar voltage vector $e_2 - e_1$, there is no angular deviation between the digital output and the actual rotating angle $\theta$ of the input shaft. However, if the digital output deviates from the actual rotational angle $\theta$ of the input shaft, an angular deviation always exists between the digital output and the polar voltage vector $e_2 - e_1$. It should be noted that a vector $E_o$ as indicated in FIG. 14(b) corresponds to a digital output [000 - - - ] which is obtained when the rotational angle $\theta$ of the input shaft coincides with the phase voltage $S_1$ in the polyphase-synchro (in the case where the zero adjustment has been completed), and the polar vector $e_2 - e_1$ is used as a polarity discrimination vector as will be described hereinafter.

Furthermore, an output $2^{12}$ constituting MSB (most significant bit) is obtained simultaneously with the polarity discrimination of the phase signal the $S_1$ from the polyphase-synchro by comparing it with a reference source, and the output $2^{12}$ is brought into "1" or "0" at an instant when the reset signal RST is reverted to "1". However, in the case of FIG. 14(b), if the output $2^{12}$ becomes "1", the vector $E_o$ will be inverted to $E_o'$, and thereby the vector $e_2 - e_1$ will be exceeded. For this reason, the output $2^{12}$ is brought back to "0" and maintained in "0" state.

Then, at a time instant $m_2$ when the reset signal RST becomes "1", the allocation pulse $PD_1$ is issued thereby to place the gate 13 in the ON state. Thus, when the reversing pulse QM is applied to another input of the gate 13, the output $2^{11}$ is brought into "1". When the output $2^{11}$ becomes "1", the vector $E_o$ is shifted to the position of a vector $E_1$, thus exceeding the polar vector $e_2 - e_1$. As a result, the polarity discriminating signal CMR1 becomes "1" thus causing the signal Qn to become "1" at an instant $m_3$, and the output $2^{11}$ is brought back to "0" through the gate 13 and the flip-flop 13.

Thus, if the allocating pulse $PD_2$ is issued, the output $2^{10}$ is temporarily brought into "1" by the introduction of the reversing pulse QM at a time instant $m_4$. When the output $2^{10}$ becomes "1", the vector $E_o$ is shifted to the position $E_2$, which is well in front of the vector $e_2 - e_1$, thereby causing the polarity discriminating signal $CMR_1$ to become "0". Accordingly, the signal Qn does not become "1" state.

Likewise, in the case where the allocating pulse $PD_3$ is issued, the output $2^9$ is temporarily brought into "1" by the introduction of the reversing pulse QM at a time instant $m_6$. In this case, since the output $2^{10}$ is held at "1", the vector is shifted from the position $E_2$ to $E_3$. Thus, it exceeds the limiting line $e_2 - e_1$, causing the polarity discriminating signal $CMR_1$ to become "1", and hence the signal Qn is brought into "1" at a time instant $m_7$, whereby the output $2^9$ is brought back to "0".

The above described procedure is repeated for the following outputs such as $2^8$, $2^7$, - - - , which are temporarily brought into "1". When the polarity discriminating signal $CMR_1$ becomes "1", the output is reversed to "0", and when signal $CMR_1$ becomes "0", the output is held in "1" state. In accordance with the progress of the above processes, the deviation of a vector position from the polarity discriminating vector $e_2 - e_1$ is constantly reduced, and ultimately the vector coincides with the polarity discriminating vector $e_2 - e_1$, whereby the rotational angle $\theta$ can be converted into a digital value.

Since the digital signals thus obtained are in the form of a signal train sampled from a half cycle of the carrier wave, the train of signals obtained from the flip-flops 1 through 13, and a signal $2^{12}$, must be once stored in a register if the train of digital signals are to be used in a controlling system. Thus the digital signals can be obtained at any time when required by sending a read-out signal Ro to the register. In this way, the digital signals can be obtained in parallel, which is very advantageous from the viewpoint of the signal processing.

An advantageous feature of this example is that the high-speed conversion of synchro signal to digital signals can be completed in one half cycle of the carrier frequency. Although in the first embodiment of this invention, an a.c. power source is used in the entire system, the polarity discrimination has been carried out in both negative and positive half cycles of the carrier wave. Accordingly, the operational speed of this embodiment is restricted ultimately by the frequency of the carrier wave. Since this restriction is posed by the utilization of a reference source for the polarity discrimination, a far higher speed of operation may be obtained if the polarity is discriminated by utilizing the positive and negative signs of a DC voltage. A second embodiment of the invention wherein the system is partly changed into a DC system, and operations are controlled in that part of the system, is shown in FIG. 15.

Figure 15:
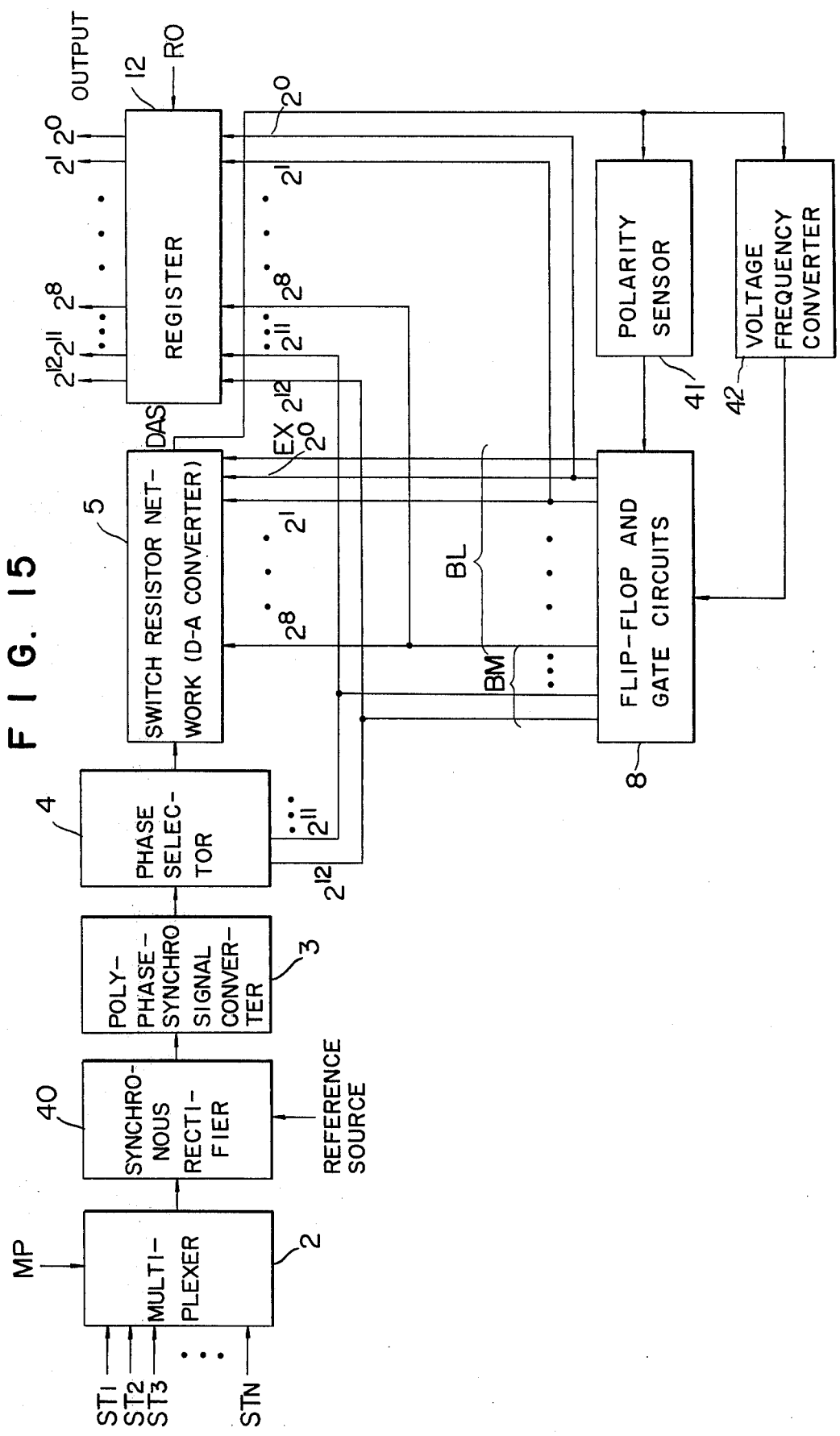
FIG. 15 is a block diagram showing another example of the synchro-to-digital converter constituting a second embodiment of the present invention.

Referring to FIG. 15, a synchronous rectifier 40 is provided immediately in advance of a polyphase-synchro signal converter 3, and the input signals are rectified therein in a synchronized manner with a reference signal. As a result, three phase DC signals such as $VS_2 = E_m \sin \theta$, $VS_1 = E_m \sin (\theta + 2\pi/3)$, and $VS_3 = E_M \sin (\theta + 4\pi/3)$ are obtained whereas, in the previous embodiment, these voltages should have been expressed as $VS_1 = E_m \sin \theta \cdot \sin 2\pi f$, and so on. In this case, a solid state phase selector 4 may be as shown in FIG. 6, but a wound type polyphase-synchro 3, as indicated in FIG. 3, cannot be used.

Furthermore, in this example, an output DAS from the switch resistor network 5 is also a DC output, and the polarity sensor 41 simply discriminates the polarity signs thereof. Other components of this embodiment of the invention are quite similar to those indicated in FIG. 2, except a oscillator 9, a clock pulse control circuit 10, and pulse distributor 11, are omitted, and a voltage frequency converter 42 is connected between the output side of the switch resistor network 5 and the input side of the "flip-flop and gate circuits" 8 because, in this example, no timing pulses SQM synchronized with the carrier are required.

This embodiment has advantages over the previous embodiment of the invention in that the polarity discrimination can be accomplished regardless of the carrier frequency as long as the synchronous rectifier 40 is of a precision type having substantially no drift.

Although the variation speed of the rotational angle $\theta$ is somewhat restricted by the time constant of the synchronous rectifier 40, this embodiment of the invention is further advantageous over the previous embodiment in that the change-over speed in the multiplexer 2 can be higher than that in the first embodiment.

Figure 16:
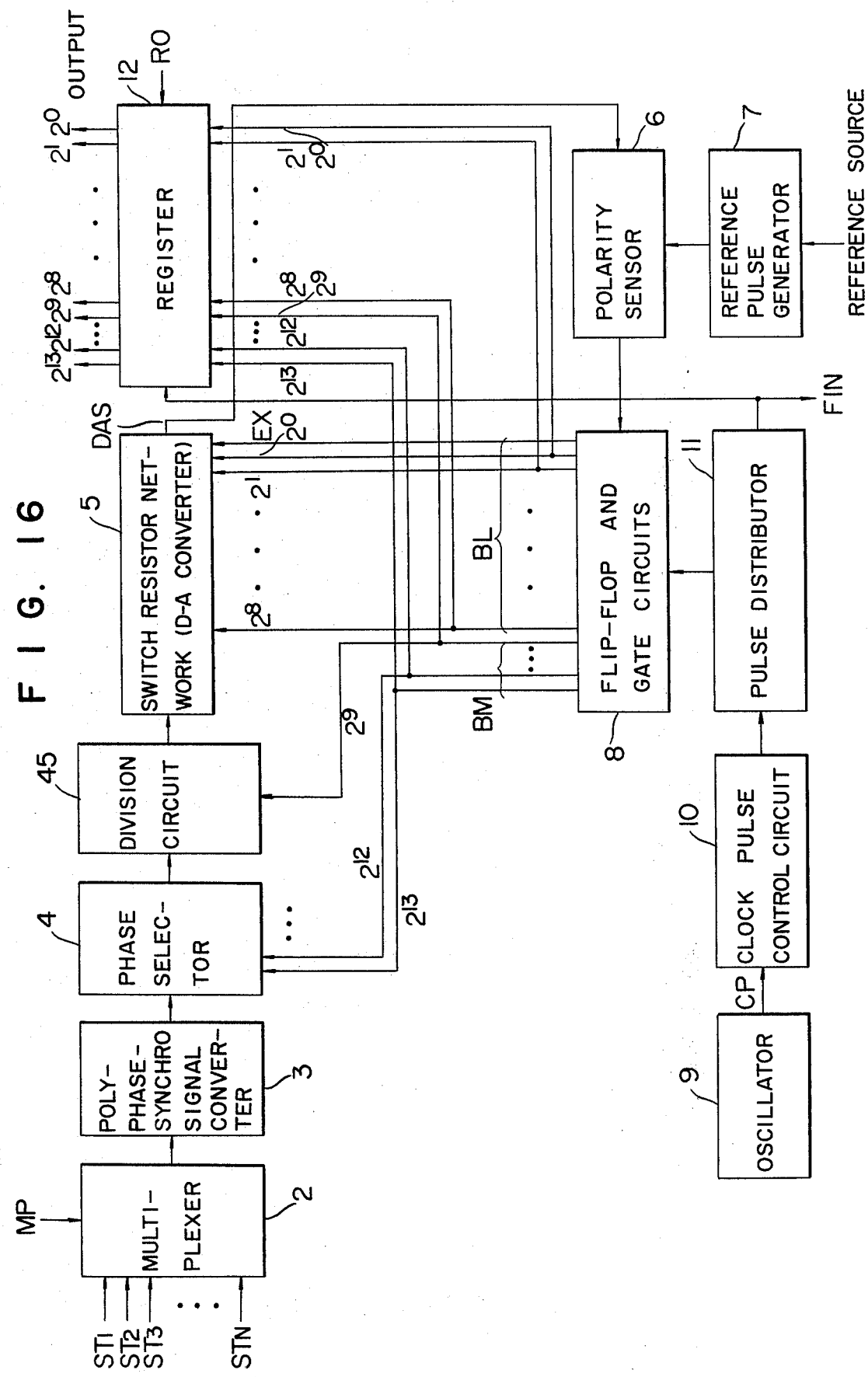
FIG. 16 is a block diagram showing still another example of the synchro-to-digital converter constituting a third embodiment of the invention.

FIG. 16 illustrates still another embodiment of the present invention, wherein a division circuit 45 follows phase selector 4 to be controlled by a bit in a lower position of the phase selecting signal BM, so that the number of the output digital signals from the synchro-to-digital converter is increased.

Figure 17:
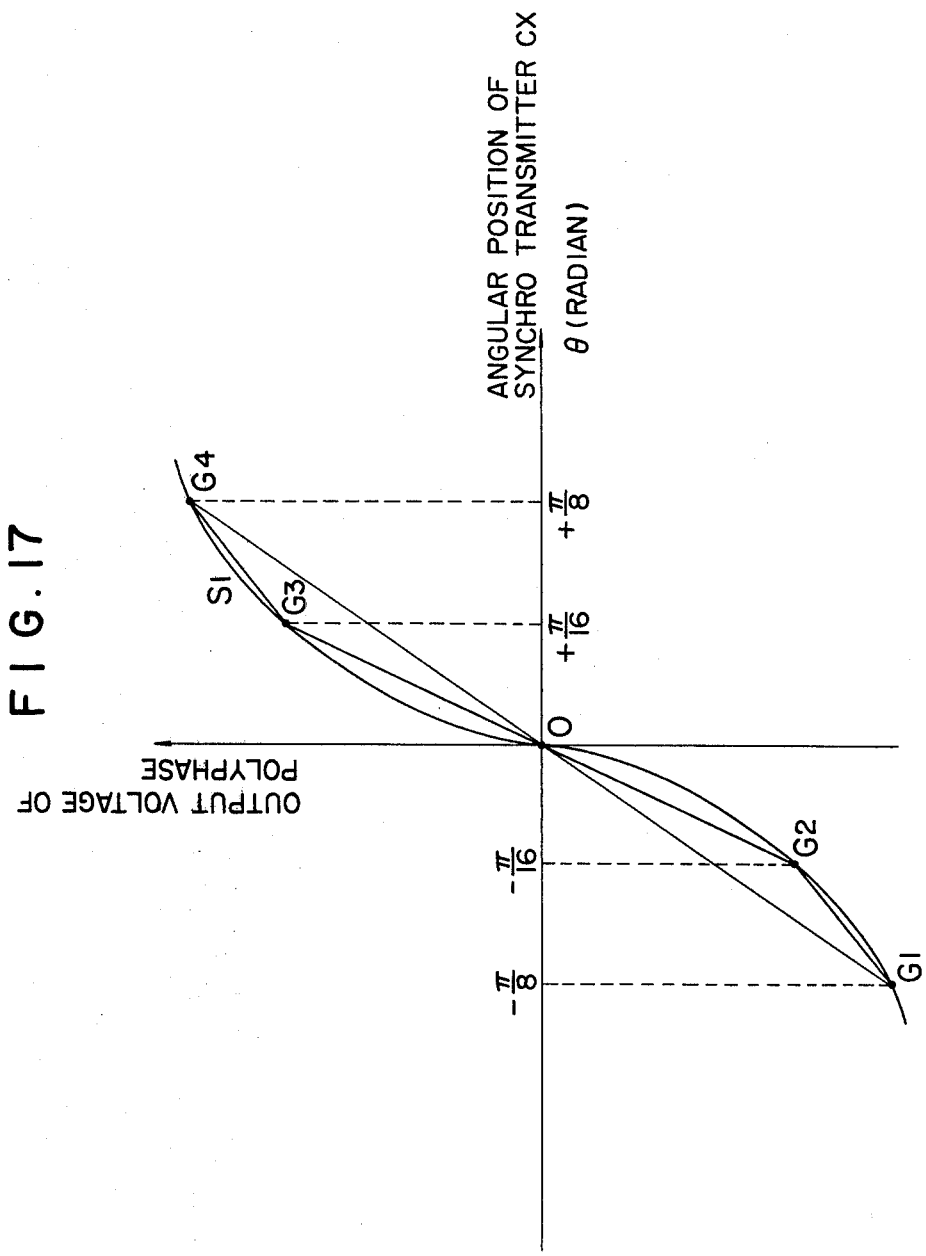
FIG. 17 is a graphical representation for a description of the example shown in FIG. 16, wherein the relation between the output of a D-A converter and a sine function is indicated.

The operation will now be described in more detail with reference to FIG. 17. In this example, a range of the phase voltage, selected as described before, is subjected to linear D-A conversion. Since the operation simulates the equivalent of a sine function, such as $S_1$, by an angled line $G_1$-$O$-$G_4$, the width of the phase voltage range thus selected must be narrowed, for instance, from $\pi/8$ to $\pi/16$ for increasing the precision of the simulation.

However, such a narrowing of the phase width necessitates changing of the 16 phase synchro to, 32 phase synchro.

However, such an increase of the phase number is almost impossible in the case of the polyphase-synchro of the wound type, and even in the case of the solid-state synchro, the adjustment thereof is not easy. In this embodiment, such a difficulty is eliminated by a simple composition of the circuit.

In the block diagram shown in FIG. 16, a lower position bit, that is, $2^9$ of a phase selecting signal BM, is introduced into the division circuit 45, and a phase range is divided, depending on "0" or "1" of the bit $2^9$, at an intermediate phase angle, so that the entire number of the thus divided phases is increased by one bit. Such an operation is carried out as shown in FIG. 18.

Figure 18:
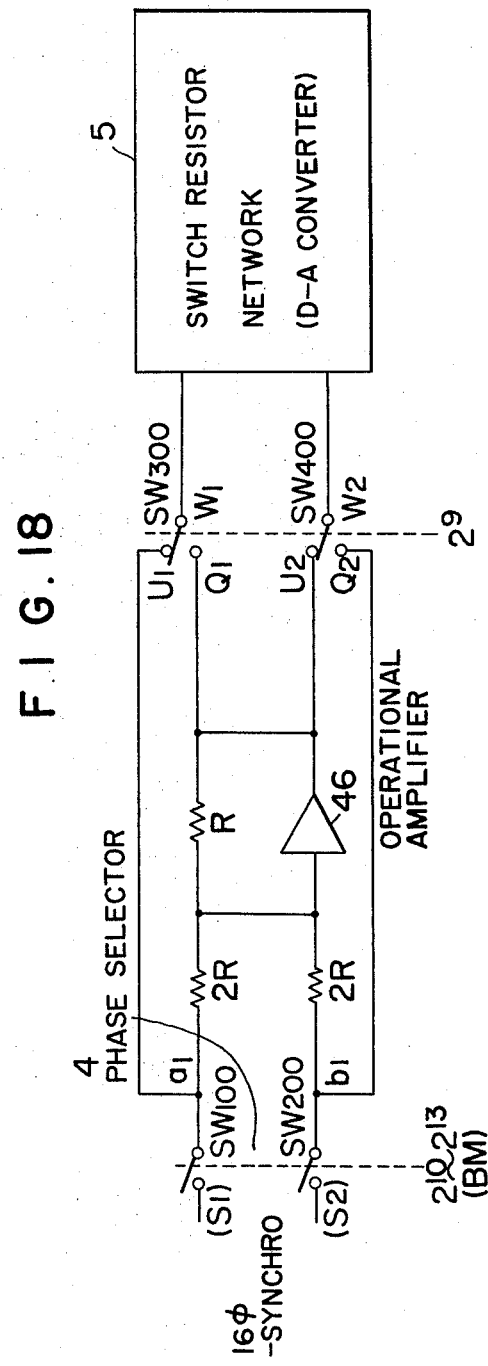
FIG. 18 is a circuit diagram showing a division circuit included in the third embodiment of the invention shown in FIG. 16.

Now, assuming that the phase selector 4 in FIG. 18 is selecting phase signals $S_1$ and $S_2$ of the polyphase-synchro, an output $VS_{12}$ obtained from an operational amplifier 46 is expressed as $$VS_{12} = \frac{R}{2R} VS_1 + \frac{R}{2R} VS_2 = \frac{VS_1 + VS_2}{2}, \quad (4)$$

where $VS_1$ is an output signal of the phase $S_1$, and $VS_2$ is an output signal of the phase $S_2$.

From the above equation, it is apparent that the output $VS_{12}$ of the operational amplifier 46 is a phase voltage having a phase angle intermediate those of the two phase voltages $S_1$ and $S_2$. Thus, the phase number utilized in the polyphase-synchro signal converter 3 is apparently doubled.

When switches $SW_{300}$ and $SW_{400}$, operated in accordance with the state, such as "0" or "1", of the bit $2^9$ are placed in the positions shown in FIG. 18, the phase range $VS_1 - VS_{12}$ is supplied to the switch resistor network 5. When the state of the bit $2^9$ is reversed, another phase range $VS_{12} - VS_2$ is supplied to the switch resistor network 5.

Since a range of phase voltage defined by two adjacent phase voltages selected by the phase selector 4 is thus divided into two halves, and either half is supplied to the subsequent switch resistor network 5 depending on the state "0" or "1" of the bit $2^9$, the number of phases of the polyphase-synchro is equivalently doubled, whereby the bit number of the synchro-to-digital converter can be easily increased. In accordance with the multiplication of the phase number, the number of the output digital values is also doubled, and the accuracy of the conversion is also increased.

Although three embodiments of the present invention operated in the pure binary code have been described above, another example which is operable in BCD code will now be described.

In the case where an operation in the BCD code is desired, the number of phase voltages obtained from the polyphase-synchro signal converter is desirably made $10^{M-N}$ phases, because an incremental number such as 1,000 or 10,000, expressed as $10^n$, is frequently used in such an operation. That is, in the case where the resultant divided number of the phase voltages is selected to be 10,000, the output phase voltages from the polyphase-synchro signal converter 3 are divided into 10 phases, and each phase range defined by two adjacent phase voltages may be further divided into 1,000 phases. When the resultant divided number of phases is selected to be 1,000, the output phase voltages of the signal converter 3 are divided into 10 phases, and each phase range defined by two adjacent phase voltages is further divided into 100 phases. Although it is rarely employed, the number of resultant divided number of the phases may also be selected to be 6,000, and in such a case, the number of phases of the output from the polyphase-synchro signal converter 3 is determined to be 6, and each phase range may be divided into 100 phases.

In each of the above described cases, an operation in BCD code is possible, and all that is required for the predetermined number of the output phase voltages from the signal converter 3 is simply to divide each phase range into 10 or 100 phases.

Thus, an example of the synchro-to-digital converter according to the present invention, wherein a 10 phase polyphase-synchro signal converter 49 is used, and each of the phase ranges is divided into 1,000 phases for producing outputs of 10,000 incremental BCD code will now be described in more detail with reference to FIG. 19.

In the example shown in FIG. 19, the polyphase-synchro signal converter 49 has 10 phases, and these outputs are supplied to a phase selector 50 operated by the output $M_{10}$ of a logic circuit 52 as described hereinafter, so that the 10 output phases are selected, with respect to the phase, in the phase selector 50. The output of the phase selector 50 is then introduced into a switch resistor network 51 as shown in FIG. 20, or a D-A converter specifically adapted for the BCD code.

The output DAS from the switch resistor network 51 is applied to the flip-flop and gate circuits 8a through a polarity sensor 6 which operates in a manner similar to that described in connection with the pure binary code. Although the operational principles of the polarity sensor 6 and the "flip-flop and gate circuits" 8a with a pulse distributor 11a are similar to those described in connection with the pure binary code, these operations will be briefly described in combination with the newly added logic circuit 52.

The phase signals selected in the phase selector 550 are D-A converted in the switch resistor network 51 by BCD coded signals $M_2$ (800 - 400 - 200 - 100), $M_3$ (80 - 40 - 20 - 10), and $M_4$ (8 - 4 - 2 - 1), also supplied into the switch resistor network 51. Since the switch resistor network 51 is constructed to be adaptable to D-A conversion of the BCD coded signals (for instance, as shown in FIG. 20), the input signals $M_2$, $M_3$, and $M_4$ may be output signals such as $2^{11}, ---, 2^0$ obtained from the flip-flops described in connection with the pure binary coded signals.

In other words, vector operations are carried out, such as first calculating the outputs from switches 800, 400, 200, and 100, in the switch resistor network 51 with the respective weights for obtaining the highest digit, then calculating the outputs from switches 80, 40, 20 and 10, with the respective weights for obtaining the subsequent digit, and so on. Accordingly, the input signals introduced into the switch resistor network 51 may be the output signals ($2^{11}, 2^{10}, ---, 2^0$) obtained from the flip-flops as described before, which are driven sequentially in a direction from higher position bits to lower position bits.

However, the phase selecting operation is different from the operation in the pure binary code. In the case of the pure binary code, the outputs of the flip-flops and the selected positions of the polyphase-synchro signals are in one-to-one correspondence as shown in Table 3. However, in the case of the BCD code, such a correspondence cannot be obtained. This difficulty can be overcome by selecting the number of division to be 8,000 or 16,000 and using polyphase-synchro signals of 8 phases or 16 phases.

Figure 19:
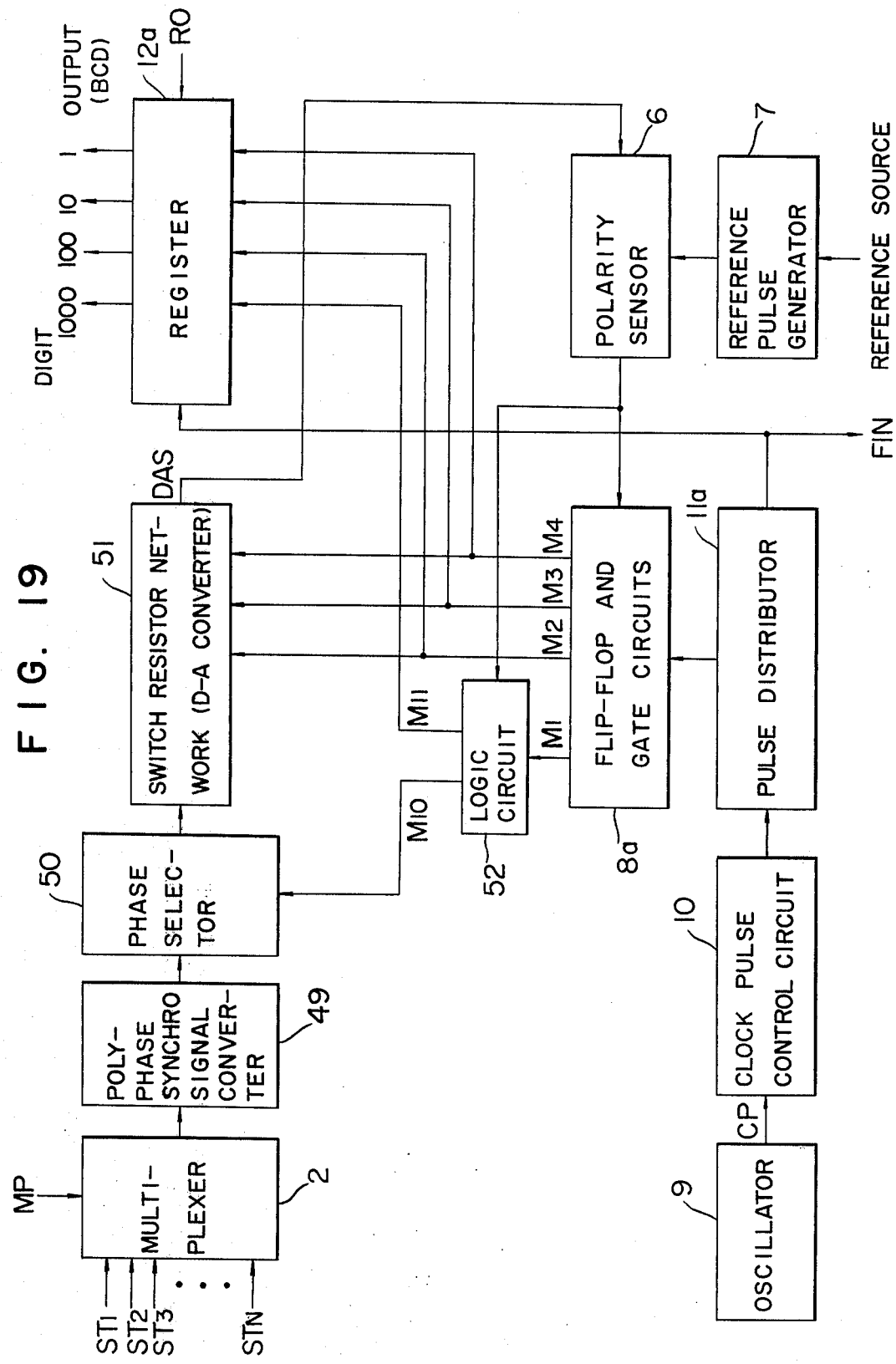
FIG. 19 is a block diagram showing still another example of the synchro-to-digital converter constituting a fourth embodiment of the invention.
Figure 20:
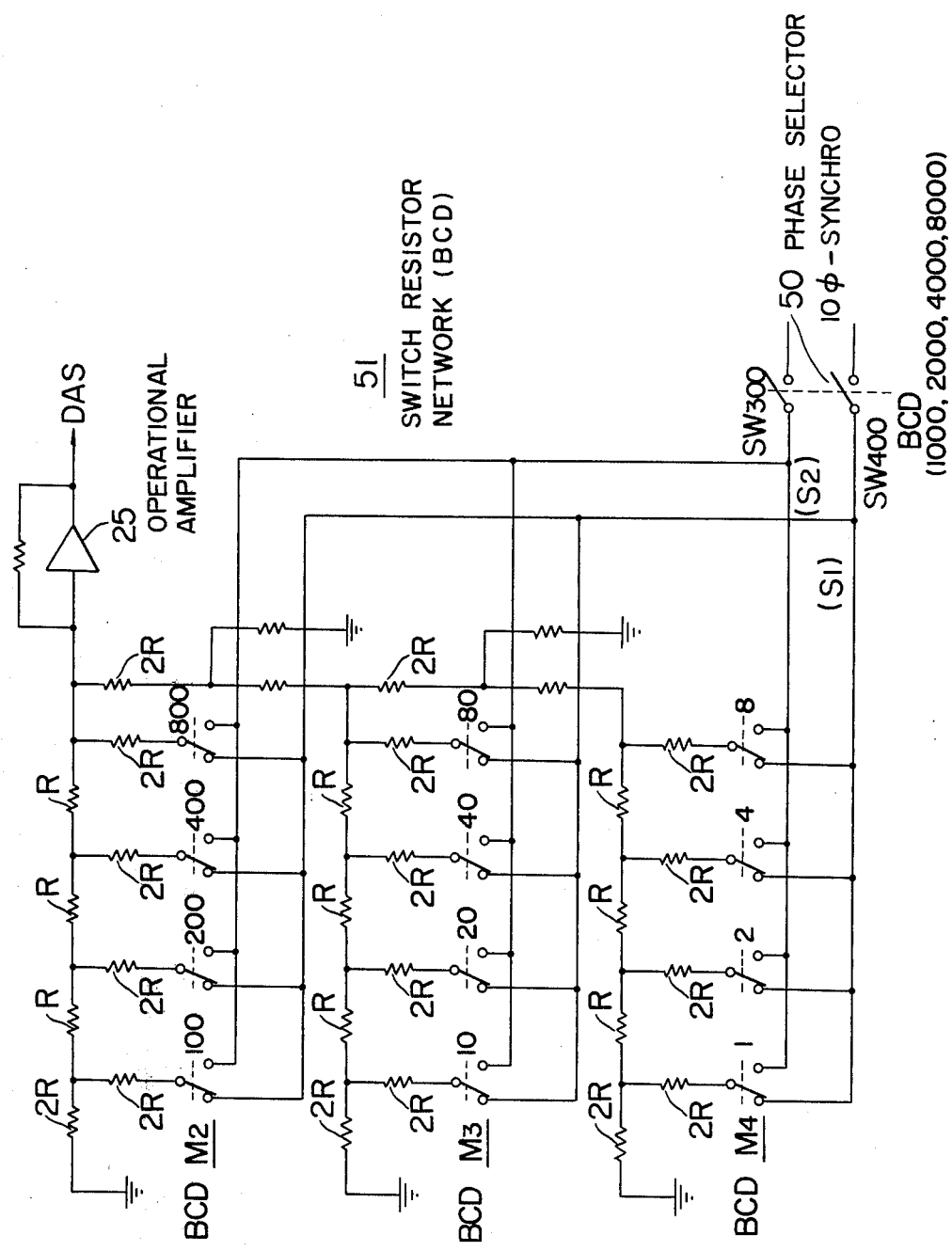
FIG. 20 is a circuit diagram showing an example of a switch resistor network included in the example shown in FIG. 19.
Figure 21:
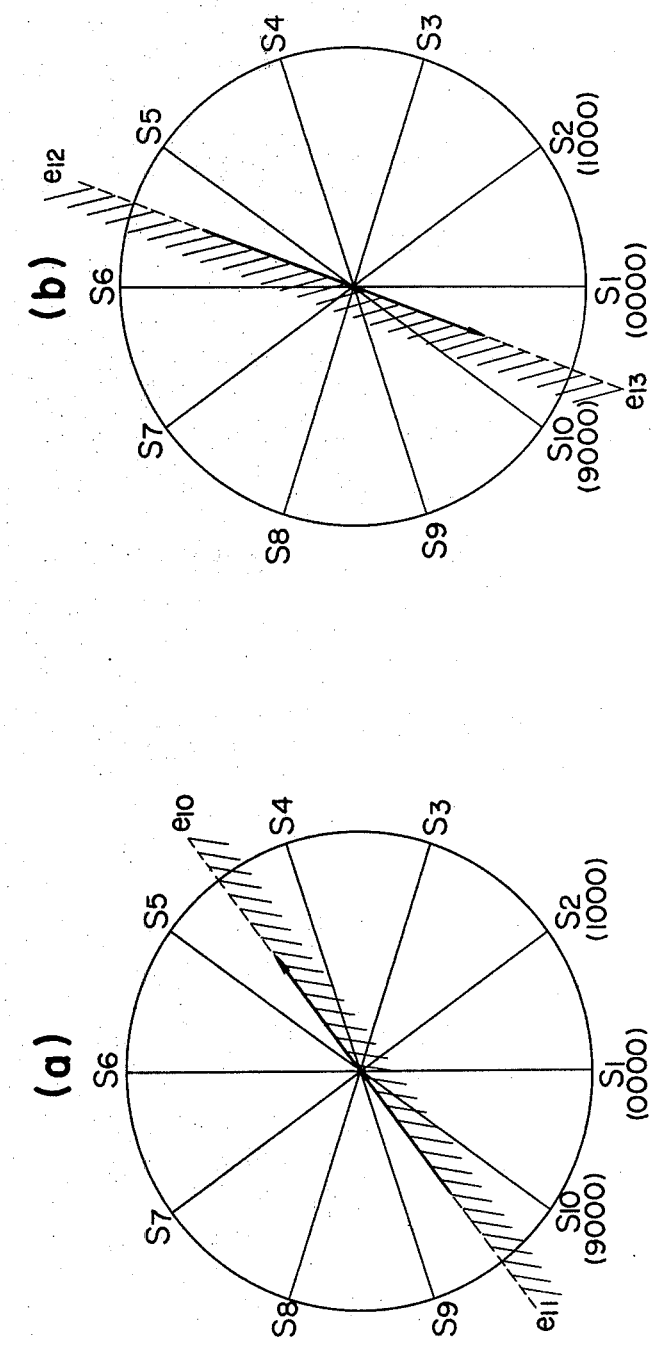
FIGS. 21(a) and 21(b) are diagrams for a description of the principle of phase selection used in the example shown in FIG, 19.

Thus, the first time allocating pulse from the pulse distributor 11a in FIG. 19 is used as a reset signal RST of the flip-flops, and the second through seventh allocating pulses $PD_1$ through $PD_6$ are used for determining the phase selecting positions of the ten phase signals. FIGS. 21 (a) and (b) illustrate the vector relations in the case of 10 phases. The logic circuit 52 is so constituted that the phase range $S_1 - S_2$ is first selected by an allocation pulse $PD_1$ when the rotational angle $\theta$ is in a position alined with $e_{11} - e_{10}$ in FIG. 21 (a). In this case, since the outputs of all of the flip-flops are reset to "0" by the first allocating pulse from the pulse distributor 11a, the above described signals $M_2$ through $M_4$ are all in "0" state. As is apparent from FIG. 20, the phase voltages $S_1$ and $S_2$ are thus delivered, without being varied, from the switch resistor network 51 as its output signal DAS. At the indicated positions of the switches, the phase voltage $S_1$ is delivered without variation as the output signal DAS of the network 51 under the control of the allocating pulse $PD_1$, and ultimately the polarity of the $S_1$ phase is discriminated.

Likewise, the polarity of the $S_2$ phase is discriminated under the control of the allocation pulse $PD_2$, and the polarities of the other phases down to the $S_5$ phase are successively discriminated as described above. During the polarity discrimination, there may be a case where the polarity is changed from "1" to "0" or from "0" to "1", whereby a phase angle at which the polarity of a phase is reversed, under the control of, for instance, an allocating pulse $PD_6$, is selected. For instance in the case of FIG. 21 (a), phases $S_1$ through $S_4$ are in the state of "0", and the phases $S_5$ through $S_{10}$ are brought into "1". Accordingly, phases $S_4 - S_5$ between which the polarity is changed from "0" to "1", are selected in this case.

Likewise in the case of FIG. 21 (b), all the phases $S_1$ through $S_5$ are in "1" state, whereby phases $S_{10}-S_1$, that is, $S_5 - S_6$, are selected to be used in the subsequent stage. Since all phases in the polyphase-synchro signals correspond to absolute values, the logic circuit 52 is so composed that it delivers a BCD code $M_{11}$ corresponding to thus selected two phases. In other words, for the allocating pulses $PD_1$ through $PD_5$, the BCD output $M_{11}$ is not delivered, and only for the allocating pulse $PD_6$, a numerical value corresponding to the selected phase position, which is 3000 (because 8000 is in "0", 400 is in "0", 200 is in "1", and 1000 is in "1") in the case of FIG. 21 (a), and is 9000 (because 8000 is in "1", 4000 is in "0", 2000 is in "0", and 1000 is in "1") in the case of FIG. 21 (b), is delivered to the register 12a.

Thus a phase interval or a phase range, wherein a rotational angle $\theta$ to be converted to a digital value is included, is selected in the phase selector 50 under the control of allocation pulses $PD_1$ through $PD_6$, and a BCD code corresponding to this phase range is delivered from the switch resistor network 51. More specifically, the two phase signals defining a phase range are supplied to the switch resistor network 51, and operations similar to those described in conjunction with the pure binary code are carried out after the time instant of the subsequent allocation pulse $PD_7$ in a manner initiated from the switch corresponding to 800 of the BCD code, and each of the digits in BCD code, such as $M_{11}, M_2, M_3$, and $M_4$ thus obtained, is once memorized in the register 12a to be thereafter read out in synchronism with a read-out signal $R_o$.

This example of the synchro-to-digital converter has the advantageous feature of allowing BCD coded outputs to be delivered through a simple arrangement, and, furthermore, by providing an additional decoder in the output side of the register 12a, outputs in 1-2-4-2' code or a decimal code may also be obtained.

This embodiment of the invention for delivering BCD coded outputs may also be composed as a d.c system as described with reference to FIG. 16, or it may also be provided with a division circuit as shown in FIG. 16 for increasing the apparent phase number. In this case, however, a change-over signal of the intermediate phase positions (corresponding to a signal $2^9$ in FIG. 16) must be obtained from a lower bit of the BCD output $M_{11}$, that is, at a half of the BCD output $M_2$ (800-400-200-100). For this reason, a value 500 of the BCD output $M_2$ is detected, and the switch positions are reversed for the two cases, one being more than 500, and the other being less than 500.

The logic operational portions in the synchro-to-digital converter allowing pure binary coded outputs or BCD coded outputs to be delivered are principally composed of the flip-flop-AND gate circuits and the pulse distributor, wherein operations are carried out sequentially from the upper position signals to the lower position signals, this constituting a characteristic feature of this example. However, since the converter is so constructed that the timing pulse SQM are obtained in a half cycle of the carrier frequency, and the discrimination of polarities and calculations of all of the digits are carried out utilizing the timing pulses, the operations must be carried out in a sampling manner wherein the cycles of reset-operation-reset-operation - - - are repeated as desired, thus constituting a drawback of this example.

In order to overcome this drawback, there is provided a synchro-to-digital converter wherein the polarity discrimination is carried out throughout a full cycle of the carrier for allowing constant delivering of outputs representing rotational angles $\theta$.

In such a system, the above described polyphase-synchro signal converter and switch resistor network are still used. However, instead of the above described flip-flop-AND a gate circuits and pulse distributor, an up-down counter is used. In the polarity sensor, there must be used a so-called tracking system wherein a polarity is discriminated throughout one full cycle of the carrier. However, if the system is converted into a d.c. system by the use of the synchronous rectifier 40 shown in FIG. 15, the system can be operated in a manner similar to in the case of a sampling system.

Figure 22:
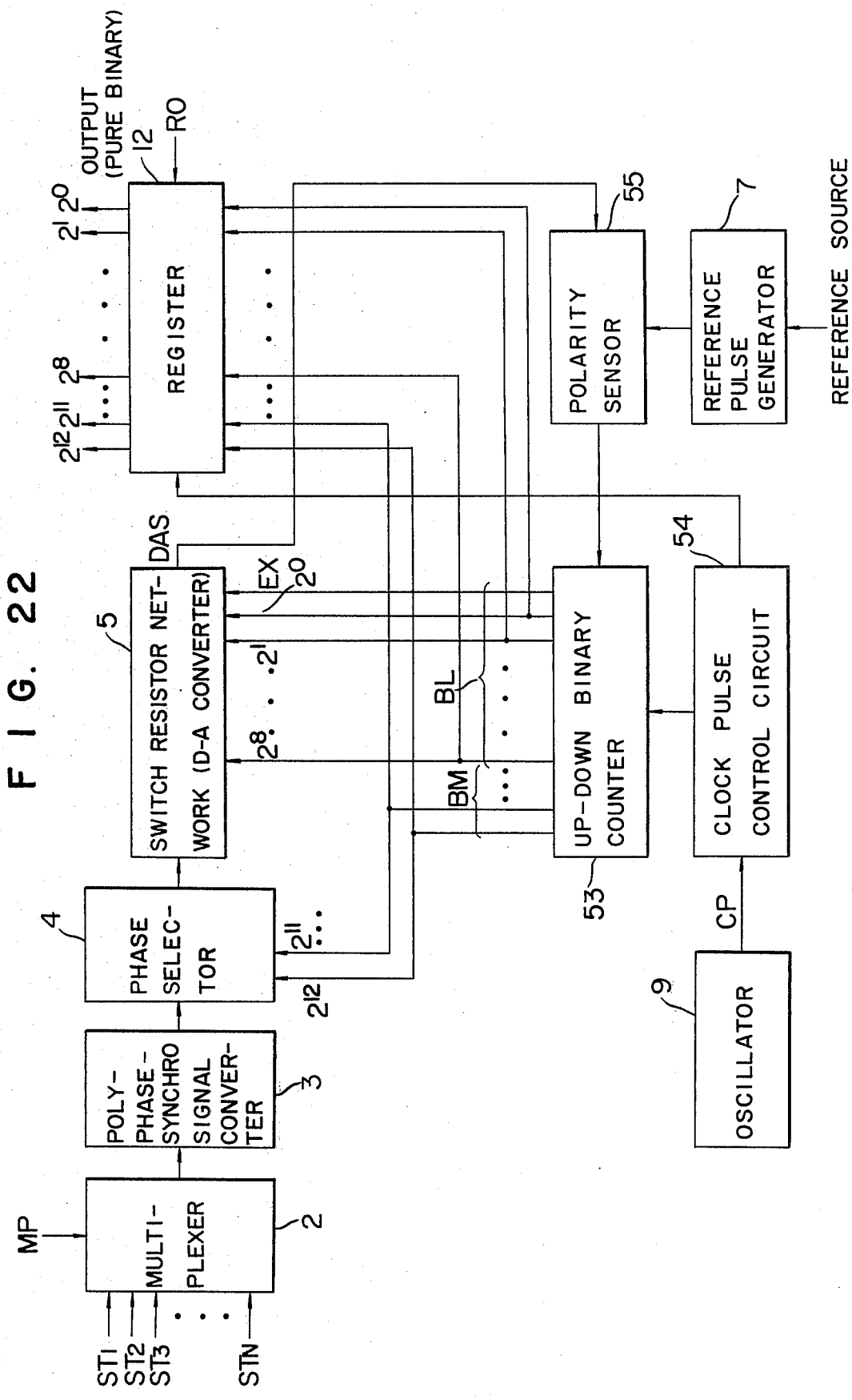
FIG. 22 is a block diagram showing still another example of the synchro-to-digital converter which constitutes a fifth embodiment of the invention.

In an example of such synchro-to-digital converter shown in FIG. 22, a binary counter 53 is used and, by the polarity discrimination in a polarity sensor 55, the up-down operation of the counter 53 is controlled.

If the output of the counter 53 is 00 - - - 0 when the line $e_2 - e_1$ in FIG. 14 coincides with the rotational angle $\theta$ in that case, the counter 53 operates upwardly due to the polarity discriminating signal, and the upward operation of the counter 53 is stopped at a position where the polarity discrimination signal becomes zero, that is, where a counted value corresponding to the position of the line $e_2 - e_1$ is attained.

In reverse, when the output value of the counter 53 is 100 - - - 0, the counter 53 is operated by the polarity discriminating signal in the downward direction until the operation is terminated at a position where the polarity discrimination signal is brought to zero. That is, a position corresponding to the line $e_2 - e_1$ is attained, and a digital value corresponding to this position is delivered as an output thereof. In either of these cases, the up-down counter 53 stops its counting operation at a position at which the polarity discrimination signal is brought to zero. Since the operational speed of the counter is determined by the clock frequency applied, thereto, the oscillation frequency of oscillator 9 must be selected to have a suitably high value. Furthermore, since the operation of the counter 53 is constantly following the rotation of the input shaft of the synchro, there is no necessity of providing the register 12, and the outputs of the counter 53 may be delivered in parallel.

Although this example has been described as delivering outputs in pure binary code, the BCD code may also be obtained by the use of an up-down BCD counter.

While specifie embodiments of the invention have been shown and described in detail to illustrate the application of the principles of the invention, it will be understood that the invention may be embodied otherwise without departing from such principles.

I claim:
1. A synchro-to-digital signal converter comprising, in combination, a polyphase-synchro signal converter connected to a synchro system to receive synchro signals therefrom, and including operational circuits each comprising an operational amplifier, first and second resistors connected in the input side of said operational amplifier, and a third resistor provided in a feedback circuit of said operational amplifier, whereby, upon reception of an output signal from a synchro rotor corresponding to an input rotational angle $\theta$ thereof, said operational circuits provide $2^n$ electrical output signals where $n$ is an integer greater than zero, having a phase angle $\alpha$ for the input rotational angle $\theta$ in the form of

$$E_m K \sin(\theta + \alpha)$$

where $E_m$ is a maximum value of a voltage $$K = \sqrt{\left(a - \frac{b}{2}\right)^2 + \left(\frac{\sqrt{3}}{2}b\right)^2}, \quad a = \frac{r_3}{r_1} \text{ and } b = \frac{r_3}{r_2}$$

$$\alpha = \tan^{-1} \frac{\frac{\sqrt{3}}{2}b}{a - \frac{b}{2}},$$

thereby to obtain output signals corresponding to an $2^n$ phase synchro; a phase selector connected to the output of said synchro signal converter and operable to supply two selected adjacent output phase signals; a single D-A converter connected to the output of said phase selector and receiving said two selected phase signals therefrom, and driven by pure binary coded signals; and an operational device, connected to said D-A converter, having a reference pulse generator for generating timing pulses synchronized with a half period of a carrier for the synchro system and operable to initiate operation of said operational device and also to generate a train of polarity discriminating pulses, a polarity sensor connected to said reference pulse generator and to said D-A converter for discriminating polarity of an output signal from said D-A converter, an oscillator generating clock pulses, a pulse distributor connected to said oscillator, flip-flop and gate circuits connected to said pulse distributor, and a clock pulse control circuit connected between said oscillator and said pulse distributor for controlling the introduction of said clock pulses to said pulse distributor and said flip-flop and gate circuits, whereby the operation of said operational device is initiated upon generation of said timing pulses, with all of the flip-flops outputs from said flip-flop and gate circuits being set to "0" upon reception of a first allocating pulse from said pulse generator, and the subsequent delivery of a second allocating pulse ad succeeding allocating pulses from said pulse distributor temporarily setting the flip-flop outputs, from the higher bit to the lower bit, to "1" through the flip-flop and gate circuits, the "1" state of the flip-flop outputs being maintained or converted to "0" depending on a polarity signal simultaneously delivered to said flip-flop and gate circuits from the said polarity sensor, thereby to carry out operation up to the least significant bit, and, when the operation up to the least significant bit is completed, delivering an operation completion signal; said operational device being connected to said phase selector to supply the higher bit signals thereto to select said two adjacent phase signals from said polyphase-synchro signal converter for supply to said single D-A converter; said operational device being connected to said D-A converter to supply the lower bit signals thereto for driving said D-A converter to convert the rotational angle of a synchro input shaft into a value expressed in a pure binary code.

* * * * *